(12) United States Patent
Ku et al.

(10) Patent No.: US 11,256,375 B1
(45) Date of Patent: Feb. 22, 2022

(54) COORDINATE CORRECTING METHOD AND ELECTRONIC DEVICE USING THE SAME

(71) Applicant: Samsung Display Co., Ltd., Yongin-Si (KR)

(72) Inventors: Jaseung Ku, Seoul (KR); Soowon Kim, Cheonan-si (KR); Suyul Seo, Incheon (KR); Suhyun Jeong, Asan-si (KR); Dong-Hwan Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/329,729

(22) Filed: May 25, 2021

(30) Foreign Application Priority Data

Jul. 30, 2020 (KR) .................. 10-2020-0095479

(51) Int. Cl.
*G06F 3/044* (2006.01)
*G06F 3/041* (2006.01)

(52) U.S. Cl.
CPC ............ *G06F 3/044* (2013.01); *G06F 3/0418* (2013.01); *G06F 2203/04105* (2013.01)

(58) Field of Classification Search
None
See application file for complete search history.

(56) References Cited

U.S. PATENT DOCUMENTS

| 8,279,180 B2 | 10/2012 | Hotelling et al. |
| 10,331,256 B2 | 6/2019 | Moon et al. |
| 10,331,268 B2 | 6/2019 | Kim et al. |
| 10,627,951 B2 | 4/2020 | Jin et al. |

FOREIGN PATENT DOCUMENTS

| KR | 10-1709152 | 2/2017 |
| KR | 10-1738864 | 5/2017 |
| KR | 10-1762278 | 7/2017 |
| KR | 10-2017-0088807 | 8/2017 |

*Primary Examiner* — Stephen T. Reed
(74) *Attorney, Agent, or Firm* — F. Chau & Associates, LLC

(57) ABSTRACT

An electronic device includes an input sensor that senses an input from an outside source to obtain a sensing coordinate. The input sensor has a plurality of sensing units defined therein. A memory stores a first modeling data obtained from first and second sensing units and a second modeling data obtained from first and third sensing units. A controller corrects the sensing coordinate to obtain a calculated coordinate. The controller comprises a first reference point moving unit that converts the sensing coordinate into a first middle coordinate based on a coordinate system having a plurality of coordinate units. A coordinate correction unit obtains a second middle coordinate by correcting the first middle coordinate based on the first and second modeling data. A second reference point moving unit obtains the calculated coordinate based on the second middle coordinate.

20 Claims, 15 Drawing Sheets

COORDINATE CORRECTING METHOD AND ELECTRONIC DEVICE USING THE SAME

CROSS-REFERENCE TO RELATED APPLICATIONS

This application claims priority under 35 U.S.C. § 119 to Korean Patent Application No. 10-2020-0095479, filed on Jul. 30, 2020 in the Korean Intellectual Property Office, the disclosure of which is incorporated by reference in its entirety herein.

1. TECHNICAL FIELD

The present inventive concepts herein relate to an electronic device and a coordinate correcting method with increased coordinate accuracy.

2. DISCUSSION OF RELATED ART

An electronic device may include a display panel for displaying images and an input sensor for sensing external inputs. The input sensor may be formed integrally with the display panel through a continuous process. The input sensor may also be formed through a separate process from the process for forming the display panel and may then be coupled to the display panel.

SUMMARY

The present inventive concepts provide an electronic device and a coordinate correcting method with increased coordinate accuracy.

According to an embodiment of the present inventive concepts, an electronic device includes an input sensor that senses an input from an outside source to obtain a sensing coordinate. The input sensor has a plurality of sensing units defined therein. A memory stores a first modeling data and a second modeling data. The first modeling data is obtained from a first sensing unit and a second sensing unit of the plurality of sensing units. The second sensing unit is positioned adjacent to the first sensing unit in a first direction. The second modeling data is obtained from the first sensing unit and a third sensing unit of the plurality of sensing units. The third sensing unit is positioned adjacent to the first sensing unit in a second direction that crosses the first direction. A controller is configured to correct the sensing coordinate to obtain a calculated coordinate. The controller comprises a first reference point moving unit configured to convert the sensing coordinate into a first middle coordinate based on a coordinate system having a plurality of coordinate units. Each coordinate unit of the plurality of coordinate units is defined by a width of each of the plurality of sensing units. A coordinate correction unit is configured to obtain a second middle coordinate by correcting the first middle coordinate based on the first modeling data and the second modeling data. A second reference point moving unit is configured to obtain the calculated coordinate based on the second middle coordinate.

In an embodiment, the first modeling data may have sensing values for input values continuously input along the first direction from an intermediate point of the first sensing unit to an intermediate point of the second sensing unit.

In an embodiment, the second modeling data may have sensing values for input values continuously input along the second direction from the intermediate point of the first sensing unit to an intermediate point of the third sensing unit.

In an embodiment, the first modeling data may be stored in the memory in the form of a first function and the second modeling data may be stored in the memory in the form of a second function.

In an embodiment, the first function and the second function may have the same shape.

In an embodiment, the first middle coordinate may include a first x-coordinate and a first y-coordinate, and the second middle coordinate may include a second x-coordinate and a second y-coordinate, and the coordinate correction unit may obtain the second x-coordinate by substituting the first x-coordinate in a first inverse function of the first function, and the second y-coordinate by substituting the first y-coordinate in a second inverse function of the second function.

In an embodiment, each of the first modeling data and the second modeling data may be stored in the memory in the form of a lookup table.

In an embodiment, the memory may further include a reference coordinate which is a reference point of the sensing coordinate in the coordinate system.

In an embodiment, the first middle coordinate may be a remainder of a value obtained by subtracting the reference coordinate from the sensing coordinate and then dividing a result value of the subtraction by the width.

In an embodiment, the memory may further include an integer value obtained by dividing the sensing coordinate by the width.

In an embodiment, the calculated coordinate may be a value obtained by adding the second middle coordinate, a value obtained by multiplying the integer value by the width, and the reference coordinate.

In an embodiment, each of the plurality of sensing units may include an electrode extending in the first direction and a cross electrode extending in the second direction and insulated from and crossing the electrode.

In an embodiment, the input sensor may sense an input by a touch through a change in mutual capacitance between the electrode and the cross electrode and the input sensor may also sense an input by an input device through a change in capacitance of each of the electrode and the cross electrode.

According to an embodiment of the present inventive concepts, a method for correcting coordinates includes obtaining a sensing coordinate from an input sensor having a plurality of sensing units defined therein. A first modeling data is obtained from a first sensing unit and a second sensing unit of the plurality of sensing units. The second sensing unit is positioned adjacent to the first sensing unit in a first direction. A second modeling data is obtained from the first sensing unit and a third sensing unit of the plurality of sensing units. The third sensing unit is positioned adjacent to the first sensing unit in a second direction crossing the first direction. The sensing coordinate is converted into a first middle coordinate based on a coordinate system having a plurality of coordinate units. Each coordinate unit of the plurality of coordinate units is defined by a width of each of the plurality of sensing units. A second middle coordinate is obtained by correcting the first middle coordinate based on the first modeling data and the second modeling data. A calculated coordinate is obtained based on the second middle coordinates.

In an embodiment, the obtaining of the first modeling data may include obtaining a first function having sensing values for input values continuously input along the first direction from an intermediate point of the first sensing unit to an intermediate point of the second sensing unit.

In an embodiment, the first middle coordinate may include a first x-coordinate and a first y-coordinate, and the second middle coordinate may include a second x-coordinate and a second y-coordinate, and the obtaining the second middle coordinates may be performed by obtaining a second x-coordinate by substituting the first x-coordinate in a first inverse function of the first function and a second y-coordinate by substituting the first y-coordinate in a second inverse function of the second function.

In an embodiment, the first function and the second function may have the same shape.

In an embodiment, the converting of the sensing coordinate into the first middle coordinate may include subtracting a reference coordinate, which is a reference point of the sensing coordinate, from the sensing coordinate in the coordinate system, and calculating a remainder of a value obtained by dividing a result value of the subtraction by the width.

In an embodiment, the obtaining of the calculated coordinate may include adding the second middle coordinate, a value obtained by multiplying an integer value, which is obtained by dividing the sensing coordinate by the width, by the width, and the reference coordinate.

In an embodiment, an electronic device includes an input sensor configured to sense an input from an outside source to obtain a sensing coordinate. The input sensor has a plurality of sensing units defined therein. A memory stores a first modeling data and a second modeling data obtained from the plurality of sensing units. A controller is configured to correct the sensing coordinate to obtain a calculated coordinate based on the first modeling data and the second modeling data.

BRIEF DESCRIPTION OF THE FIGURES

The accompanying drawings are included to provide a further understanding of the present inventive concepts, and are incorporated in and constitute a part of this specification. The drawings illustrate embodiments of the present inventive concepts and, together with the description, serve to explain principles of the present inventive concepts. In the drawings.

DETAILED DESCRIPTION OF EMBODIMENTS

Figure 1:
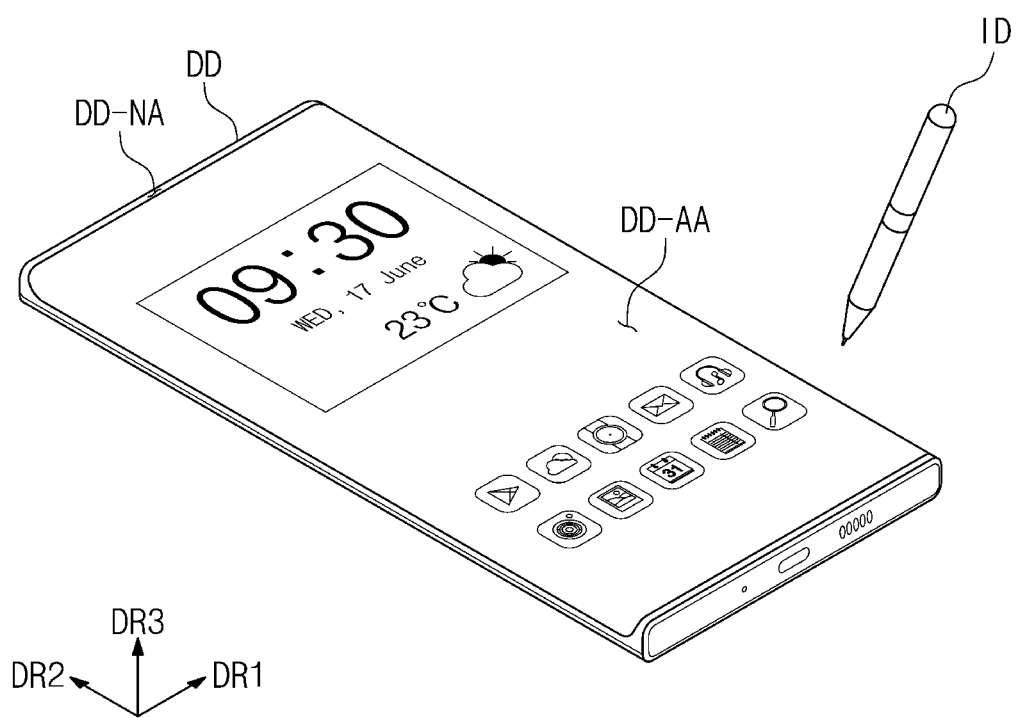
FIG. 1 is a perspective view of an electronic device according to an embodiment of the present inventive concepts.

In this specification, it will be understood that when an element or layer is referred to as being "on", "connected to" or "coupled to" another element or layer, it can be directly on, connected or coupled to the other element or layer or intervening elements or layers may be present. When an element or layer is referred to as being "directly on", "directly connected to" or "directly coupled to" another element or layer, no intervening elements or layers may be present.

Like reference numerals refer to like elements throughout this specification. In addition, the thicknesses, ratios and dimensions of elements in the figures may be exaggerated for effective description of the technical contents. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. For example, a first element, component, region, layer or section discussed below could be termed a second element, component, region, layer or section without departing from the present inventive concepts. Likewise, a second element, component, region, layer or section discussed below could be termed a first element, component, region, layer or section. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe the relationship of one element or feature to another element(s) or feature(s) as illustrated in the figures. It will be understood that the spatially relative terms are intended to encompass different orientations of the device in use or operation in addition to the orientation depicted in the figures.

Unless otherwise defined, all terms (including technical and scientific terms) used herein have the same meaning as commonly understood by one of ordinary skill in the art to which the present inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the term "include" or "have", when used in this specification, specifies the presence of stated features, integers, steps, operations, elements, and/or components, but does not preclude the presence or addition of one or more other features, integers, steps, operations, elements, components, and/or groups thereof.

Hereinafter, the present inventive concepts will be explained in detail with reference to the accompanying drawings.

FIG. 1 is a perspective view of an electronic device according to an embodiment of the present inventive concepts.

Referring to FIG. 1, an electronic device DD may be a device activated according to an electrical signal. For example, in an embodiment, the electronic device DD may be a mobile phone, a tablet, a car navigation device, a game console, or a wearable device. However, embodiments of the present inventive concepts are not limited thereto and the electronic device DD may be various small, medium or large devices. As an example, FIG. 1 illustrates that the electronic device DD is a mobile phone.

In the electronic device DD, an active area DD-AA and a peripheral area DD-NA adjacent to the active area DD-AA may be defined. The electronic device DD may display an image through the active area DD-AA. The active area DD-AA may include a plane defined by a first direction DR1 and a second direction DR2. The second direction DR2 may cross the first direction DR1. For example, as shown in the embodiment of FIG. 1, the second direction DR2 may be perpendicular to the first direction DR1. However, embodiments of the present inventive concepts are not limited thereto. The thickness direction of the electronic device DD may be parallel to the third direction DR3 crossing the first direction DR1 and the second direction DR2. For example, the third direction DR3 may be perpendicular to the first and second directions DR1, DR2. Accordingly, a front surface (e.g., an upper surface) and a rear surface (e.g., a lower surface) of a member constituting the electronic device DD may be defined on the basis of the third direction DR3.

The electronic device DD may sense external inputs applied from an outside source with respect to the electronic device DD. The external inputs may be user inputs. In an embodiment, the user inputs may include various types of external inputs such as a part of a user's body, light, heat, pressure or the like. However, embodiments of the present inventive concepts are not limited thereto.

As shown in the embodiment of FIG. 1, the electronic device DD may sense an input by a user's touch and an input by an input device ID. The input device ID may mean a device other than a user's body. For example, the input device ID may be an active pen, a stylus pen, a touch pen, an electronic pen, or various other devices. Hereinafter, the active pen will be described as an example of the input device ID for convenience of explanation. However, embodiments of the present inventive concepts are not limited thereto.

The electronic device DD and the input device ID may perform bidirectional communication. The electronic device DD may provide an uplink signal to the input device ID. For example, in an embodiment, the uplink signal may include a synchronization signal or information on the electronic device DD. However, embodiments of the present inventive concepts are not limited thereto. The input device ID may provide a downlink signal to the electronic device DD. In an embodiment, the downlink signal may include a synchronization signal or state information on the input device ID. For example, the downlink signal may include coordinate information of the input device ID, battery information of the input device ID, tilt information of the input device ID, and/or various information stored in the input device ID. However, embodiments of the present inventive concepts are not limited thereto.

Figure 2:
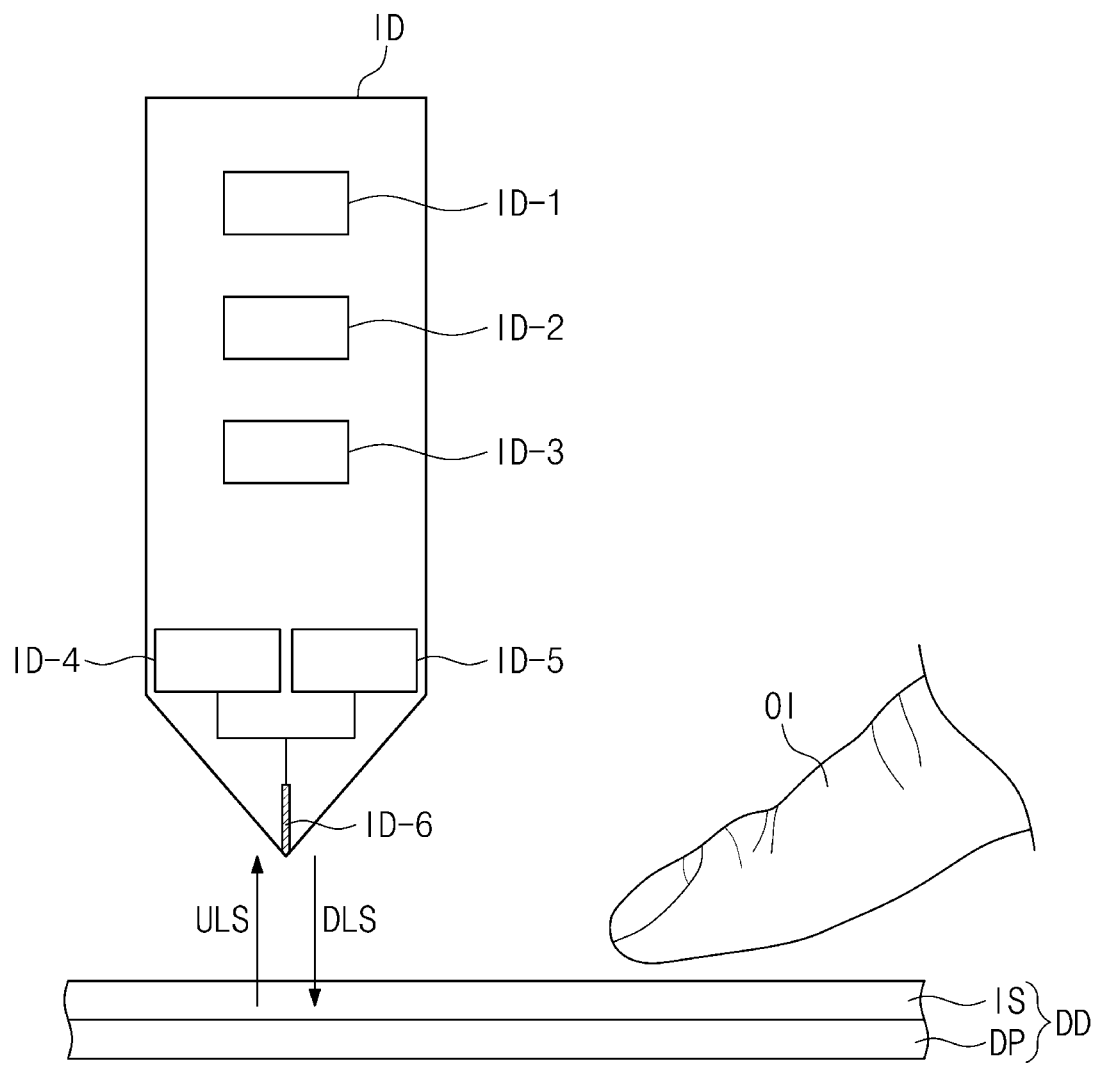
FIG. 2 is a block diagram illustrating an electronic device and an input device according to an embodiment of the present inventive concepts.

FIG. 2 is a block diagram schematically illustrating an electronic device and an input device according to an embodiment of the present inventive concepts.

Referring to FIG. 2, an electronic device DD may include a display panel DP and an input sensor IS.

The display panel DP may be a component that generates an image. The display panel DP may be a light emitting display panel. For example, the display panel DP may include an organic light emitting display panel, a quantum dot display panel, a micro LED display panel, or a nano-LED display panel. However, embodiments of the present inventive concepts are not limited thereto.

The input sensor IS may be disposed on the display panel DP. For example, as shown in the embodiment of FIG. 2, a lower surface of the input sensor IS may directly contact an upper surface of the display panel DP. The input sensor IS may detect an external input applied from an outside source. For example, the input sensor IS may sense both an input by a user's body OI and an input by an input device ID which may be the outside source. For example, as shown in the embodiment of FIG. 2, the input by the user's body OI may be a touch from the user's finger. However, embodiments of the present inventive concepts are not limited thereto.

In an embodiment, the input sensor IS may be driven in a time-division driving method. For example, the input sensor IS may be repeatedly driven alternately in a first mode and in a second mode. The first mode may be a mode for detecting an input by a user's body OI, and the second mode may be a mode for detecting an input by an input device ID.

In the second mode, the input sensor IS may provide an uplink signal ULS to the input device ID. When the input device ID receives the uplink signal ULS and is synchronized with the electronic device DD, the input device ID may provide a downlink signal DLS toward the input sensor IS.

As shown in the embodiment of FIG. 2, the input device ID may include a power supply ID-1, a memory ID-2, a controller ID-3, a transmitter ID-4, a receiver ID-5, and a pen electrode ID-6. However, components constituting the input device ID are not limited to the components listed above and the numbers of the components are not limited to those shown in the embodiment of FIG. 2. For example, the input device ID may further include an electrode switch configured to switch the operation mode of the pen electrode ID-6 to a signal transmission mode or a signal reception mode, a pressure sensor configured to sense pressure, a rotation sensor configured to sense rotation, or the like.

In an embodiment, the power supply ID-1 may include a battery, a high-capacity capacitor, or the like, which supplies power to the input device ID. The memory ID-2 may store function information on the input device ID. The controller ID-3 may control operation of the input device ID. Each of the transmitter ID-4 and the receiver ID-5 may communicate with the electronic device DD through the pen electrode ID-6. The transmitter ID-4 may be referred to as a signal generator or a transmission circuit, and the receiver ID-5 may be referred to as a signal receiver or a reception circuit. The input sensor IS may obtain a coordinate or inclination of the input device ID through the pen electrode ID-6.

Figure 3A:
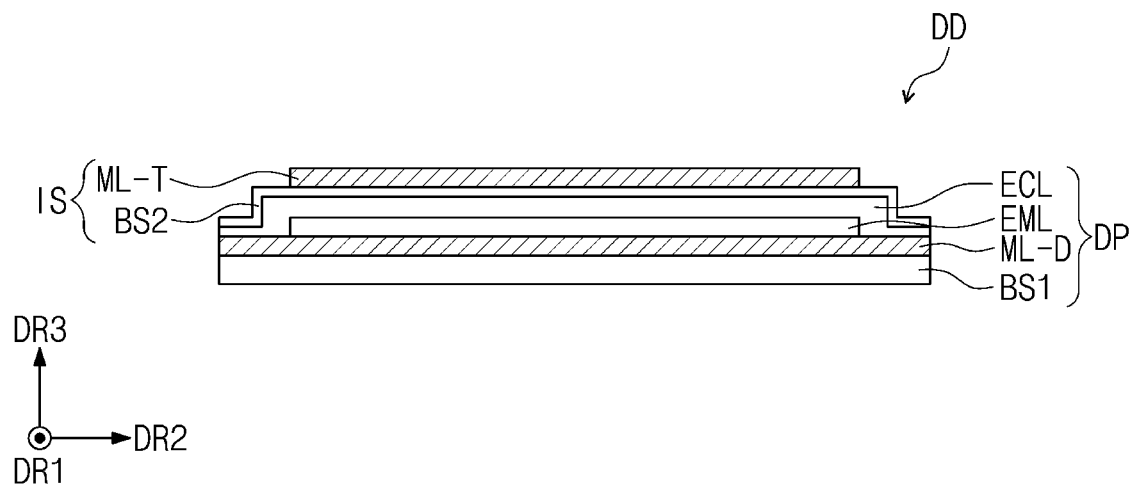
FIG. 3A is a cross-sectional view of an electronic device according to an embodiment of the present inventive concepts.

FIG. 3A is a cross-sectional view of an electronic device according to an embodiment of the present inventive concepts.

Referring to FIG. 3A, the electronic device may include a display panel DP and an input sensor IS.

The display panel DP may include a base layer BS1, a circuit layer ML-D, a light emitting device layer EML, and an encapsulation layer ECL.

The base layer BS1 may be a member that provides a base surface on which the circuit layer ML-D is disposed. In an embodiment, the base layer BS1 may be a glass substrate, a metal substrate, a polymer substrate, or the like. However, the composition of the base layer BS1 according to an embodiment of the present inventive concepts is not limited thereto. For example, the base layer BS1 may be an inorganic layer, an organic layer, or a composite material layer.

The base layer BS1 may have a multilayered structure. For example, in an embodiment, the base layer BS1 may include a first synthetic resin layer, a silicon oxide layer disposed on the first synthetic resin layer, an amorphous silicon layer disposed on the silicon oxide layer, and a second synthetic resin layer disposed on the amorphous silicon layer. The silicon oxide layer and the amorphous silicon layer may be referred to as a base barrier layer.

In an embodiment, each of the first and second synthetic resin layers may include a polyimide-based resin. In addition, each of the first and second synthetic resin layers may include at least one of an acrylate-based resin, a methacrylate-based resin, a polyisoprene-based resin, a vinyl-based resin, an epoxy-based resin, an urethane-based resin, a cellulose-based resin, a siloxane-based resin, a polyamide-based resin, or a perylene-based resin. In this specification, a specific compound-based resin means to include a functional group of the specific compound. For example, an acrylate-based resin means to include a functional group of acrylate.

The circuit layer ML-D may be disposed on the base layer BS1. In an embodiment, the circuit layer ML-D may include an insulating layer, a semiconductor pattern, a conductive layer, a signal line, and the like. In an embodiment, the insulating layer, the semiconductor layer, and the conductive layer may be formed on the base layer BS1 by a coating method, vapor deposition or the like and thereafter, the insulating layer, the semiconductor layer, and the conductive layer may be selectively patterned through a plurality of photolithography processes to form a semiconductor pattern, a conductive pattern, and a signal line included in the circuit layer ML-D.

The light emitting device layer EML may be disposed on the circuit layer ML-D. The light emitting device layer EML may include a light emitting device. For example, the light emitting device layer EML may include an organic light emitting material, a quantum dot, a quantum rod, a micro-LED, or a nano-LED. However, embodiments of the present inventive concepts are not limited thereto.

The encapsulation layer ECL may be disposed on the light emitting device layer EML. The encapsulation layer ECL may include an inorganic layer, an organic layer, and an inorganic layer which are sequentially laminated. However, the layers constituting the encapsulation layer ECL are not limited thereto and the encapsulation layer ECL may include at least one inorganic layer and at least one organic layer having various different arrangements.

The inorganic layers may protect the light emitting device layer EML from moisture and oxygen, and the organic layer may protect the light emitting device layer EML from a foreign substance such as a dust particle. In an embodiment, the inorganic layers may include a silicon nitride layer, a silicon oxynitride layer, a silicon oxide layer, a titanium oxide layer, an aluminum oxide layer, or the like. The organic layer may include an acrylic-based organic layer. However, embodiments of the present inventive concepts are not limited thereto.

In an embodiment, the input sensor IS may be formed on the display panel DP through a continuous process. In this embodiment, the input sensor IS may be described as being directly disposed on the display panel DP. Being directly disposed may mean that a third component is not disposed between the input sensor IS and the display panel DP (e.g., in the third direction DR3). For example, a separate adhesive member may not be disposed between the input sensor IS and the display panel DP. In this embodiment, the thickness of the electronic device DD may be reduced as compared to embodiments in which a third component is disposed between the input sensor IS and the display panel DP.

As shown in the embodiment of FIG. 3A, the input sensor IS may include a base insulating layer BS2 and a sensing circuit layer ML-T.

In an embodiment, the base insulating layer BS2 may be an inorganic layer that includes at least one compound selected from silicon nitride, silicon oxynitride, and silicon oxide. Alternatively, the base insulating layer BS2 may be an organic layer including at least one material selected from an epoxy resin, an acrylic resin, or an imide-based resin. The base insulating layer BS2 may have a single-layer structure or a multilayer structure stacked along a third direction DR3.

The sensing circuit layer ML-T may be disposed on the base insulating layer BS2. The sensing circuit layer ML-T may include a plurality of insulating layers and a plurality of conductive layers. In an embodiment, the plurality of conductive layers may include a sensing electrode for sensing an external input, a sensing line electrically connected to the sensing electrode, and a sensing pad electrically connected to the sensing line. Those mentioned above will be described later.

Figure 3B:
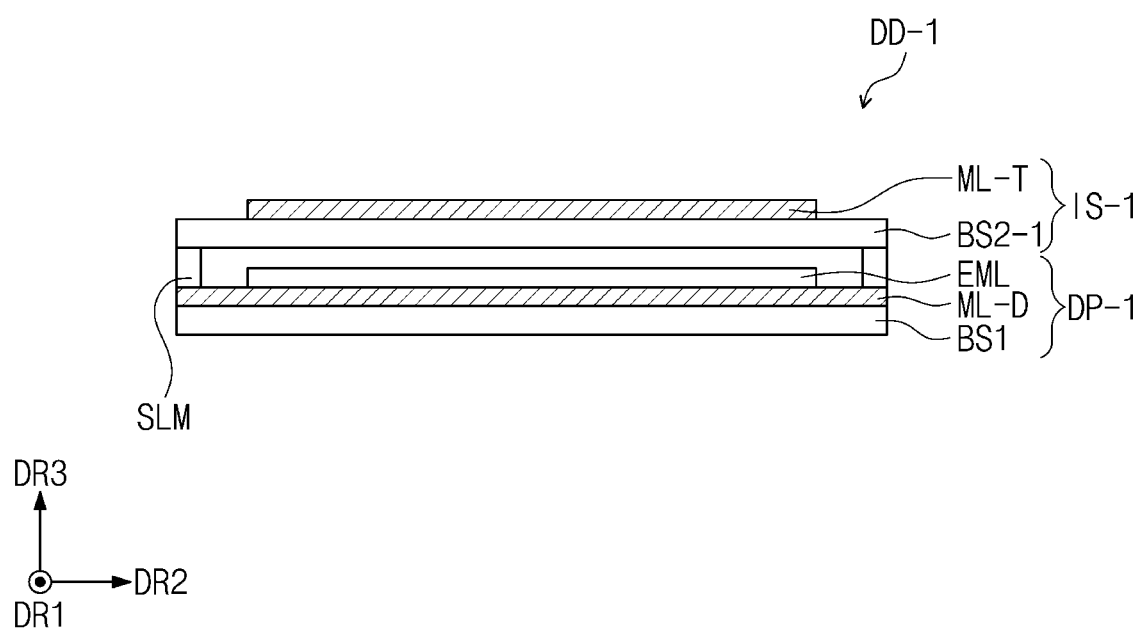
FIG. 3B is a cross-sectional view of an electronic device according to an embodiment of the present inventive concepts.

FIG. 3B is a cross-sectional view of an electronic device according to an embodiment of the present inventive concepts. In describing FIG. 3B, the same components used for FIG. 3A will have the same reference numerals as in FIG. 3A and the descriptions thereof will be omitted for convenience of explanation.

Referring to the embodiment of FIG. 3B, the electronic device DD-1 may include a display panel DP-1 and an input sensor IS-1.

The display panel DP-1 may include a base layer BS1, a circuit layer ML-D, and a light emitting device layer EML. The input sensor IS-1 may include a base insulating layer BS2-1 and a sensing circuit layer ML-T.

The base insulating layer BS2-1 may be disposed on the light emitting device layer EML. A predetermined space may be defined between the base insulating layer BS2-1 and the light emitting device layer EML (e.g., in the third direction DR3). The space may be filled with air or an inert gas. Alternatively, in an embodiment of the present inventive concepts, the space may be filled with a filler such as a silicone-based polymer, an epoxy-based resin, an acrylic-based resin, or the like. The display device DD-1 of the embodiment of FIG. 3B may not include an encapsulation layer ECL in comparison to the embodiment of FIG. 3A.

A coupling member SLM may be disposed between the base layer BS1 and the base insulating layer BS2-1 (e.g., in the third direction DR3). The coupling member SLM may couple the base layer BS1 and the base insulating layer BS2-1. In an embodiment, the coupling member SLM may include an organic material such as a photocurable resin or a photoplastic resin, or may include an inorganic material such as a frit seal. However, embodiments of the present inventive concepts are not limited thereto and the coupling member SLM may include various different materials.

Figure 4:
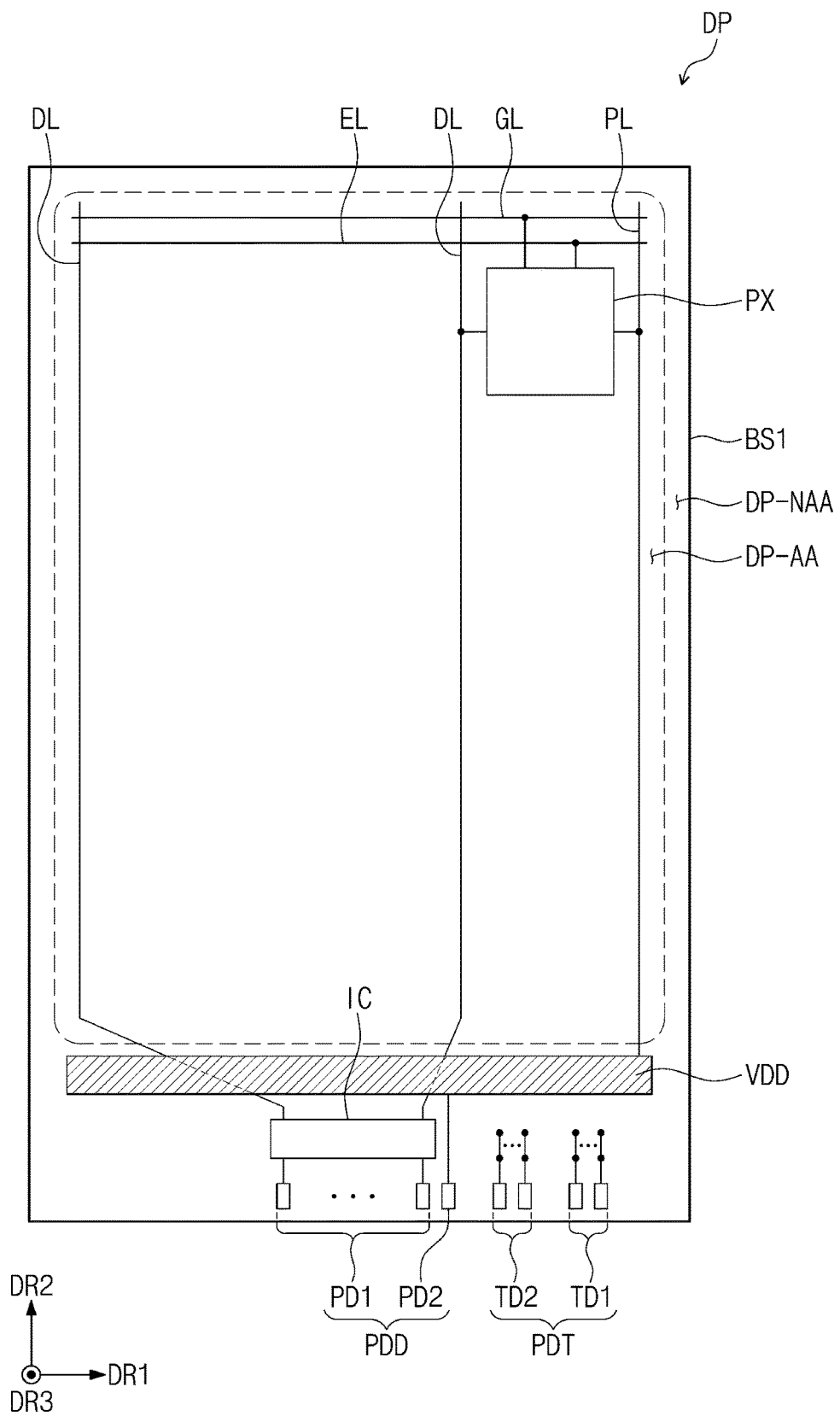
FIG. 4 is a plan view of a display panel according to an embodiment of the present inventive concepts.

FIG. 4 is a plan view of a display panel according to an embodiment of the present inventive concepts.

Referring to FIG. 4, an active area DP-AA and a peripheral area DP-NAA adjacent to the active area DP-AA may be defined in the display panel DP. The active area DP-AA may be an area in which an image is displayed. While FIG. 4 shows only a single pixel PX for convenience of illustration, a plurality of pixels PX may be disposed in the active area DP-AA. The active area DP-AA of the display panel may overlap the active area DD-AA (see FIG. 1) of the electronic device DD (see FIG. 1). The peripheral area DP-NAA may be an area in which an image is not displayed and a drive circuit, a drive line, or the like may be disposed thereon.

Each of the plurality of pixels PX may display one among primary colors or one among mixed colors. The primary colors may include red, green or blue. The mixed colors may include various colors such as white, yellow, cyan, or magenta. However, embodiments of the present inventive concepts are not limited thereto and the plurality of pixels PX may display various different colors.

The display panel DP may include a base layer BS1, a plurality of pixels PX, a plurality of signal lines such as a plurality of scan lines GL, a plurality of data lines DL, a plurality of power lines PL, and a plurality of emission control lines EL. The display panel DP may also include a plurality of display pads PDD, and a plurality of sensing pads PDT.

The plurality of signal lines, such as the plurality of scan lines GL, the plurality of data lines DL, the plurality of power lines PL, and the plurality of emission control lines EL, may be disposed on the base layer BS1. The base layer BS1 may be the base layer BS1 of the embodiment of FIG. 3A. The plurality of signal lines, such as the plurality of scan lines GL, the plurality of data lines DL, the plurality of power lines PL, and the plurality of emission control lines EL, are connected to the plurality of pixels PX to transmit electrical signals thereto. While the embodiment of FIG. 4 shows the plurality of signal lines including a plurality of scan lines GL, a plurality of data lines DL, a plurality of power lines PL, and a plurality of light emission control lines EL, embodiments of the present inventive concepts are not limited thereto and the configuration of the plurality of signal lines may be variously modified. For example, the plurality of signal lines according to an embodiment of the present inventive concepts may further include initialization voltage lines.

A power pattern VDD may be disposed in the peripheral area DP-NAA. The power pattern VDD may be connected to a plurality of power lines PL. The power pattern VDD may permit the display panel DP to provide the same power signal to each of the plurality of pixels via the power lines PL.

The plurality of display pads PDD may be disposed in the peripheral area DP-NAA. As shown in the embodiment of FIG. 4, the plurality of display pads PDD may include a first pad PD1 and a second pad PD2. In an embodiment, the first pad PD1 may be provided in plurality. The plurality of first pads PD1 may be electrically connected to the plurality of data lines DL, respectively. The second pad PD2 may be connected to the power pattern VDD to be electrically connected to the plurality of power lines PL. The display panel DP may provide the plurality of pixels PX with electrical signals provided from an outside device through the plurality of display pads PDD. However, embodiments of the present inventive concepts are not limited thereto and the plurality of display pads PDD may further include pads for receiving other electrical signals in addition to the first pad PD1 and the second pad PD2.

A drive chip IC may be mounted in the peripheral area DP-NAA. In an embodiment, the drive chip IC may be a chip-type timing control circuit. The plurality of data lines DL may be electrically connected to the plurality of first pads PD1 through the drive chip IC, respectively. However, embodiments of the present inventive concepts are not limited thereto, and the drive chip IC may be variously arranged. For example, in an embodiment of the present inventive concepts, the drive chip IC may be mounted on a film that is separate from the display panel DP. In this embodiment, the drive chip IC may be electrically connected to the plurality of display pads PDD through the film.

The plurality of sensing pads PDT may be disposed in the peripheral area DP-NAA and may be spaced apart from the plurality of display pads PDD. The plurality of sensing pads PDT may be electrically connected to the plurality of sensing pads of the input sensor IS (see FIG. 3A), respectively, which will be described later. As shown in the embodiment of FIG. 4, the plurality of sensing pads PDT may include a plurality of first sensing pads TD1 and a plurality of second sensing pads TD2. However, embodiments of the present inventive concepts are not limited thereto.

Figure 5A:
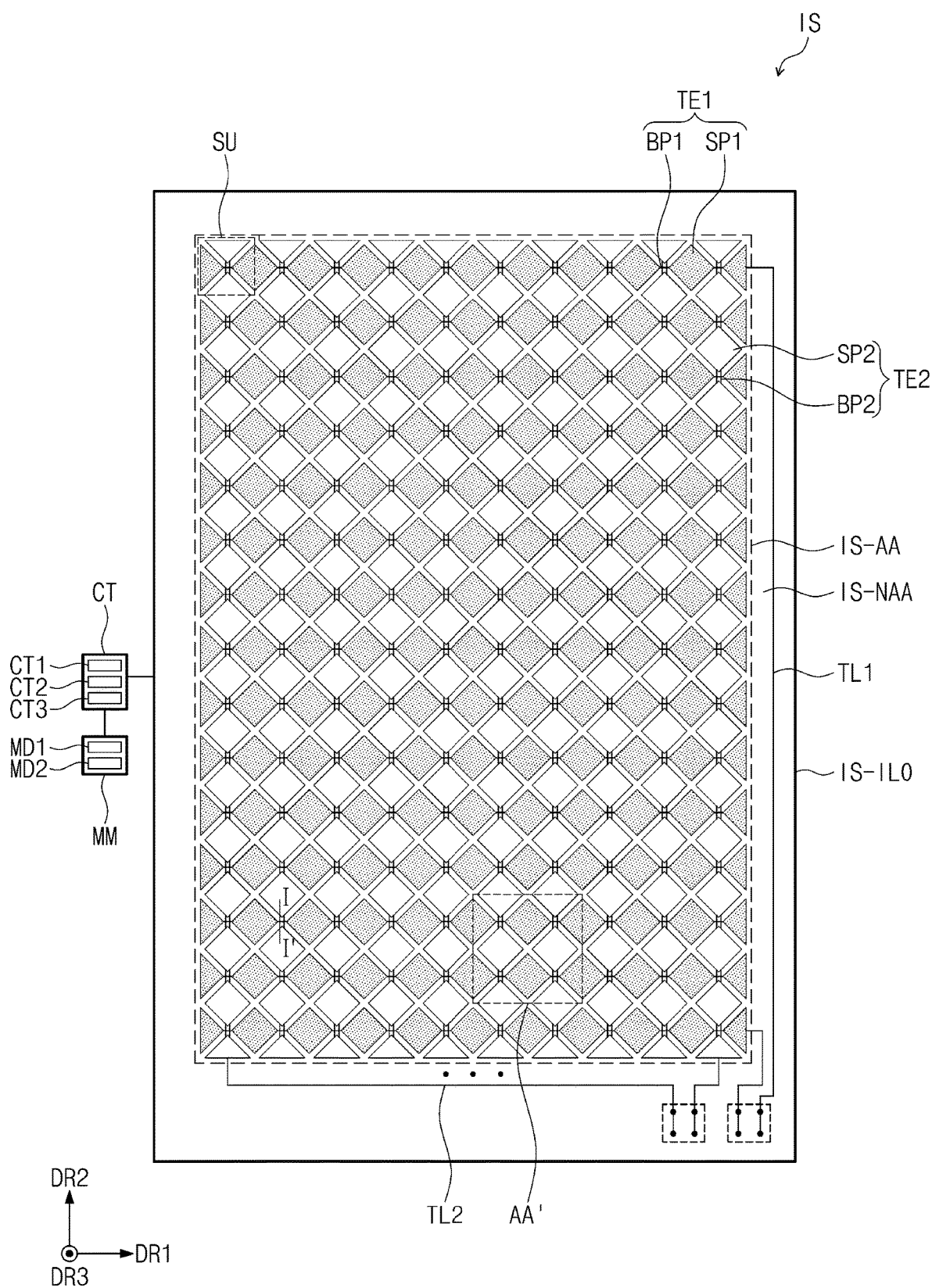
FIG. 5A illustrates an input sensor, a controller, and a memory according to an embodiment of the present inventive concepts.
Figure 5B:
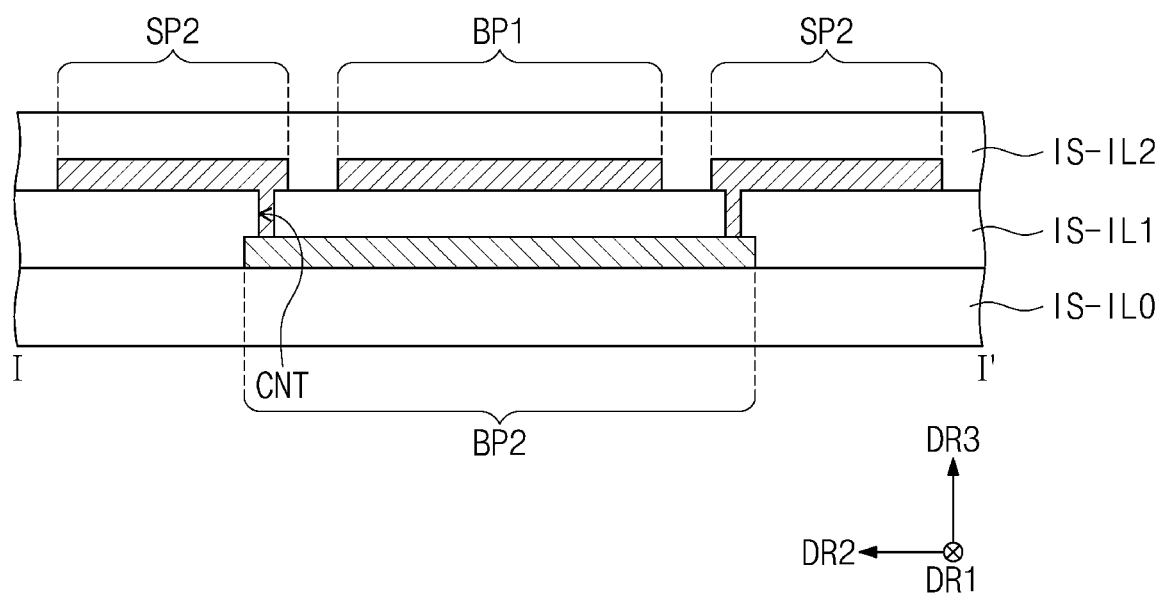
FIG. 5B is a cross-sectional view taken along the line I-I' of FIG. 5A according to an embodiment of the present inventive concepts.
Figure 6:
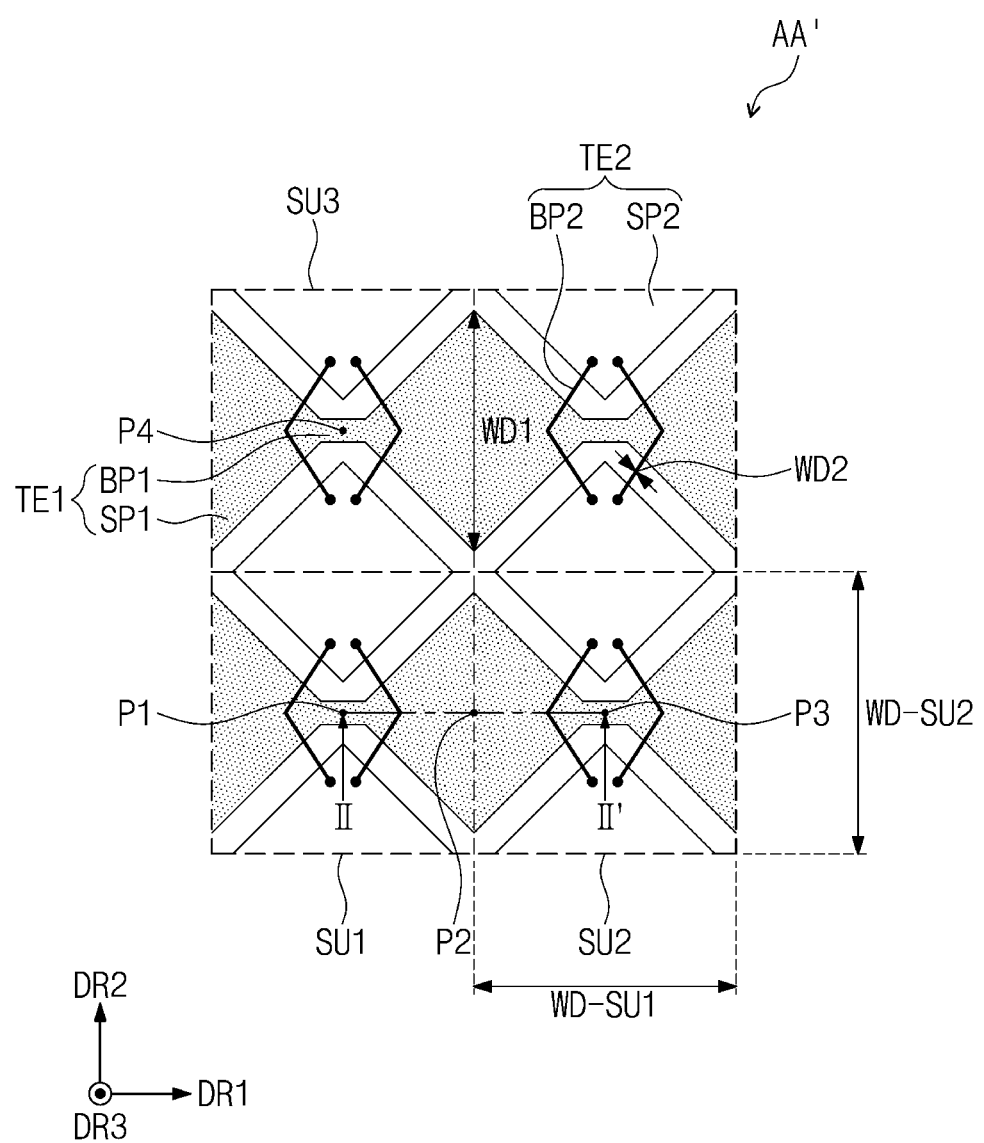
FIG. 6 is a enlarged plan view showing area AA' of FIG. 5A according to an embodiment of the present inventive concepts.

FIG. 5A illustrates an input sensor, a controller, and a memory according to an embodiment of the present inventive concepts. FIG. 5B is a cross-sectional view taken along line I-I' of FIG. 5A according to an embodiment of the present inventive concepts. FIG. 6 is an enlarged plan view showing area AA' of FIG. 5A according to an embodiment of the present inventive concepts.

Referring to FIG. 5A to FIG. 6, an active area IS-AA and a peripheral area IS-NAA may be defined in the input sensor IS. The active area IS-AA may be an area which is activated by an electrical signal. The active area IS-AA of the input sensor IS may overlap (e.g., in the third direction DR3) the active area DP-AA (see FIG. 4) of the display panel DP (see FIG. 4).

A plurality of sensing units SU may be defined in the active area IS-AA. As shown in the embodiment of FIG. 5A, the plurality of sensing units SU may be arranged along the first direction DR1 and the second direction DR2 and each of the plurality of sensing units SU may be spaced apart from each other (e.g., in the first and/or second directions DR1, DR2). For example, the area AA' of FIG. 5A shown in FIG. 6 includes four sensing units which include a first sensing unit SU1, a second sensing unit SU2 and a third sensing unit SU3. Each of the plurality of sensing units SU may have the substantially same dimensions (e.g., in a plane defined in the first and second directions DR1, DR2).

The peripheral area IS-NAA may surround the active area IS-AA. For example, as shown in the embodiment of FIG. 5A, the peripheral area IS-NAA may surround each side of the active area IS-AA (e.g., in the first and second directions DR1, DR2) to fully surround the active area IS-AA. However, embodiments of the present inventive concepts are not limited thereto. The peripheral area IS-NAA of the input sensor IS may overlap (e.g., in the third direction DR3) the peripheral area DP-NAA (see FIG. 4) of the display panel DP (see FIG. 4).

The input sensor IS may include a base insulating layer IS-IL0, a plurality of sensing electrodes, such as a plurality of electrodes TE1 and a plurality of cross electrodes TE2, and a plurality of sensing lines, such as a plurality of first sensing lines TL1 and a plurality of second sensing lines TL2.

The base insulating layer IS-IL0 may be the base insulating layer BS2 (see FIG. 3A) of FIG. 3A.

The plurality of sensing electrodes, such as the plurality of electrodes TE1 and the plurality of cross electrodes TE2, may be disposed in the active area IS-AA. Each of the plurality of sensing electrodes, such as the plurality of electrodes TE1 and the plurality of cross electrodes TE2, may have a single-layer structure or a multilayer structure stacked along the third direction DR3.

The plurality of sensing electrodes, such as the plurality of electrodes TE1 and the plurality of cross electrodes TE2, having a single-layer structure may include a metal layer or a transparent conductive layer. In an embodiment, the metal layer may include molybdenum, silver, titanium, copper, aluminum, or an alloy thereof. The transparent conductive layer may include a transparent conductive oxide such as indium tin oxide (ITO), indium zinc oxide (IZO), zinc oxide (ZnO), indium zinc tin oxide (IZTO), or the like. In addition, the transparent conductive layer may include a conductive polymer such as PEDOT, a metal nanowire, graphene, or the like. However, embodiments of the present inventive concepts are not limited thereto.

The plurality of sensing electrodes, such as the plurality of electrodes TE1 and the plurality of cross electrodes TE2, having a multi-layer structure may include metal layers. For example, the metal layers may have a three-layer structure of titanium/aluminum/titanium. The multilayered conductive layer may include at least one metal layer and at least one transparent conductive layer. However, embodiments of the present inventive concepts are not limited thereto.

As shown in the embodiment of FIG. 5A, each of the plurality of electrodes TE1 may extend longitudinally substantially in the first direction DR1 and may be arranged in the second direction DR2. Each of the plurality of electrodes TE1 may include a plurality of first portions SP1 and a plurality of second portions BP1. The plurality of first portions SP1 may be referred to as a plurality of first sensing patterns SP1.

As shown in the embodiment of FIG. 5A, each of the plurality of cross electrodes TE2 may extend longitudinally in the second direction DR2 and may be arranged along a first direction DR1. Each of the plurality of cross electrodes TE2 may include a plurality of second sensing patterns SP2 and a plurality of bridge patterns BP2.

Although FIG. 5A illustrates that two bridge patterns BP2 are connected to two adjacent sensing patterns SP2, the arrangement of the plurality of bridge patterns BP2 and the plurality of second sensing patterns SP2 according to an embodiment of the present inventive concepts are not limited thereto. For example, two adjacent second sensing patterns SP2 may be connected by one bridge pattern BP2.

The plurality of second portions BP1 may be disposed in a layer that is different from the layer of the plurality of bridge patterns BP2. The plurality of bridge patterns BP2 may be insulated from and cross the plurality of electrodes TE1. For example, the plurality of second portions BP1 may be insulated from and cross the plurality of bridge patterns BP2, respectively.

In an embodiment, the plurality of bridge patterns BP2 may be disposed on the base insulating layer IS-IL0. For example, the plurality of bridge patterns BP2 may be disposed directly on the base insulating layer IS-IL0. A first insulating layer IS-IL1 may be disposed on the base insulating layer IS-IL0 and cover the plurality of bridge patterns BP2. The first insulating layer IS-IL1 may have a single-layer structure or a multi-layer structure. In an embodiment, the first insulating layer IS-IL1 may include an inorganic material, an organic material, or a composite material.

The plurality of second sensing patterns SP2, the plurality of first portions SP1, and the plurality of second portions BP1 may be disposed on the first insulating layer IS-IL1. For example, the plurality of second sensing patterns SP2, the plurality of first portions SP1, and the plurality of second portions BP1 may be disposed directly on the first insulating layer IS-IL1.

As shown in the embodiment of FIG. 5B, a plurality of contact holes CNT may be formed by penetrating the first insulating layer IS-IL1 in the third direction DR3. Two adjacent second sensing patterns SP2 (e.g., adjacent in the second direction DR2) among the plurality of second sensing patterns may be electrically connected to a bridge pattern BP2 through the plurality of contact holes CNT.

A second insulating layer IS-IL2 may be disposed on the plurality of sensing patterns SP2, the plurality of first portions SP1, and the plurality of second portions BP1. For example, the second insulating layer IS-IL2 may be disposed directly on the plurality of sensing patterns SP2, the plurality of first portions SP1, and the plurality of second portions BP1. The second insulating layer IS-IL2 may cover the plurality of second sensing patterns SP2, the plurality of first portions SP1, and the plurality of second portions BP1. For example, as shown in the embodiment of FIG. 5B, the second insulating layer IS-IL2 may cover an upper surface and lateral side surfaces of the second sensing patterns SP2, the plurality of first portions SP1, and the plurality of second portions BP1. The second insulating layer IS-IL2 may include a single-layer structure or a multi-layer structure. In an embodiment, the second insulating layer IS-IL2 may include an inorganic material, an organic material, or a composite material.

Although FIG. 5B illustrates a bottom bridge structure in which the plurality of bridge patterns BP2 are disposed under the plurality of sensing patterns SP2, embodiments of the present inventive concepts are not limited thereto. For example, the input sensor IS according to an embodiment of the present inventive concepts may have a top bridge structure in which the plurality of bridge patterns BP2 are disposed on an upper surface of the plurality of sensing patterns SP2, the plurality of first portions SP1, and the plurality of second portions BP1.

The plurality of first sensing lines TL1 may be electrically connected to the plurality of electrodes TE1, respectively. The plurality of second sensing lines TL2 may be electrically connected to the plurality of cross electrodes TE2, respectively.

The plurality of first sensing pads TD1 (see FIG. 4) may be electrically connected to the plurality of first sensing lines TL1 through contact holes, respectively. The plurality of second sensing pads TD2 (see FIG. 4) may be electrically connected to second sensing lines TL2 through contact holes, respectively.

As shown in the embodiment of FIG. 5A, the electronic device DD may further include a controller CT and a memory MM. The controller may correct a sensing coordinate SC (see FIG. 13A) sensed by the input sensor IS concerning the input source, such as the input from the user's body OI or the input device ID. The controller CT may include a first reference point moving unit CT1, a coordinate correction unit CT2, and a second reference point moving unit CT3. The first reference point moving unit CT1, the coordinate correction unit CT2, and the second reference point moving unit CT3 will be described later.

Figure 13A:
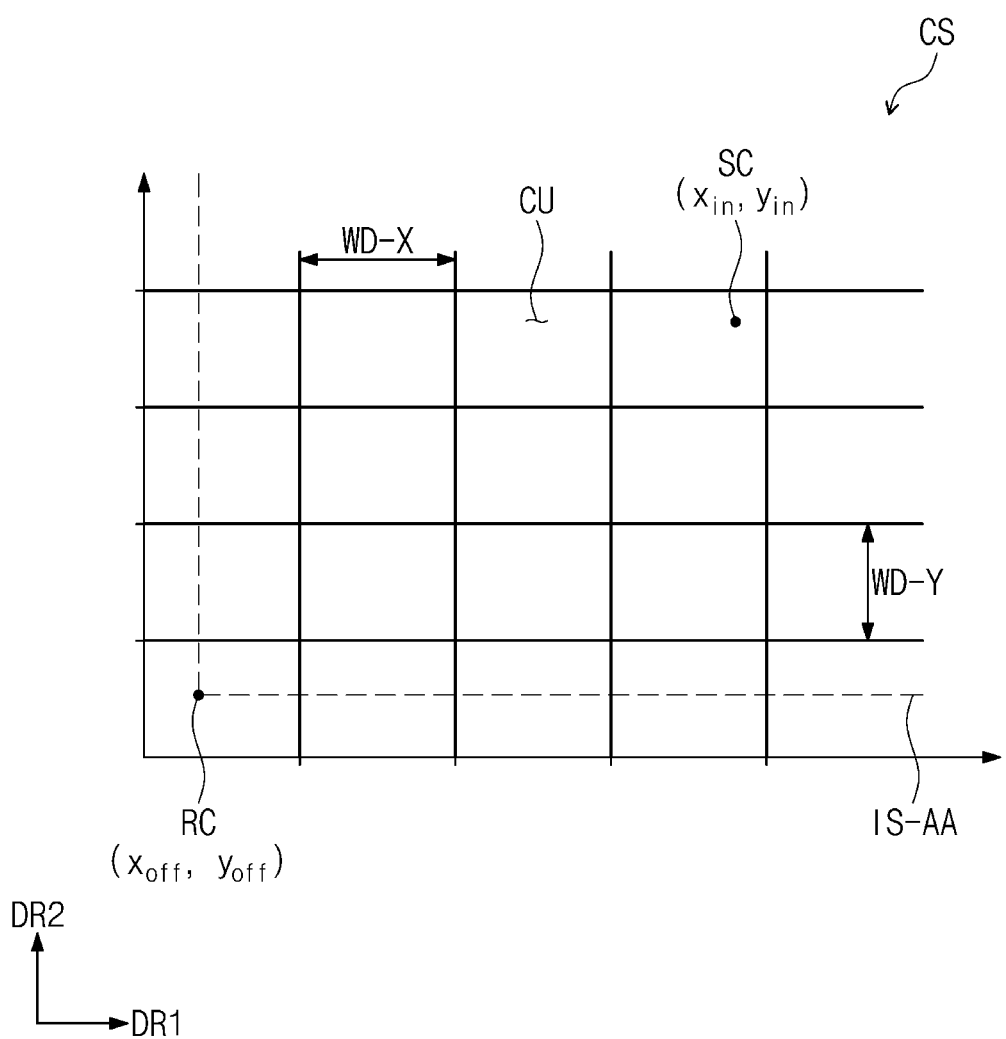
FIG. 13A illustrates obtaining a sensing coordinate according to an embodiment of the present inventive concepts.

The memory MM may store variables for correcting the sensing coordinate SC (see FIG. 13A). The memory MM may include a first modeling data MD1 and a second modeling data MD2 stored therein. The first modeling data MD1 and the second modeling data MD2 will be described later.

The input sensor IS may be operated in time division. The input sensor IS may be repeatedly driven alternately in a first mode and in a second mode. The first mode may be a touch mode which recognizes an input OI (FIG. 2) by a part of a user's body. In the first mode, the plurality of electrodes TE1 may output a sensing signal and the plurality of cross electrodes TE2 may receive a driving signal. At this time, the electronic device DD (see FIG. 2) may scan an active area IS-AA by applying a driving signal to the plurality of cross electrodes TE2 and sense an area to which a touch is applied through the sensing signal output from the plurality of electrodes TE1. For example, information on an external input may be obtained by sensing a change in capacitance formed between the plurality of electrodes TE1 and the plurality of cross electrodes TE2.

However, embodiments of the present inventive concepts are not limited thereto. For example, in an embodiment, the plurality of electrodes TE1 may receive a driving signal and the plurality of cross electrodes TE2 may output a sensing signal. Additional electrical signals may be received or output by the plurality of electrodes TE1 and/or the plurality of cross electrodes TE2.

The second mode may be different from the first mode. The second mode may be illustratively described as a pen mode which recognizes the input device ID (see FIG. 2). In the second mode, an identical sensing signal may be provided to the plurality of electrodes TE1 and the plurality of cross electrodes TE2.

The input sensor IS may detect an amount of change in voltage and current of the sensing signal provided to the plurality of electrodes TE1 and the plurality of cross electrodes TE2. For example, the input sensor IS may be driven in a way of sensing a driving signal input from an outside source, such as the input device ID (e.g., an active electrostatic pen, AES pen) in the second mode.

According to an embodiment of the present inventive concepts, the input sensor IS may obtain a sensing coordinate SC (see FIG. 13A) when a user's body OI (see FIG. 2) comes into contact with or is in proximity to the input sensor IS in the first mode, or when the input device ID (see FIG. 2) comes into contact with or is in proximity to the input sensor IS in the second mode. The controller CT may obtain a calculated coordinate CC (see FIG. 13C) on the basis of the sensing coordinate SC (see FIG. 13A).

Figure 7:
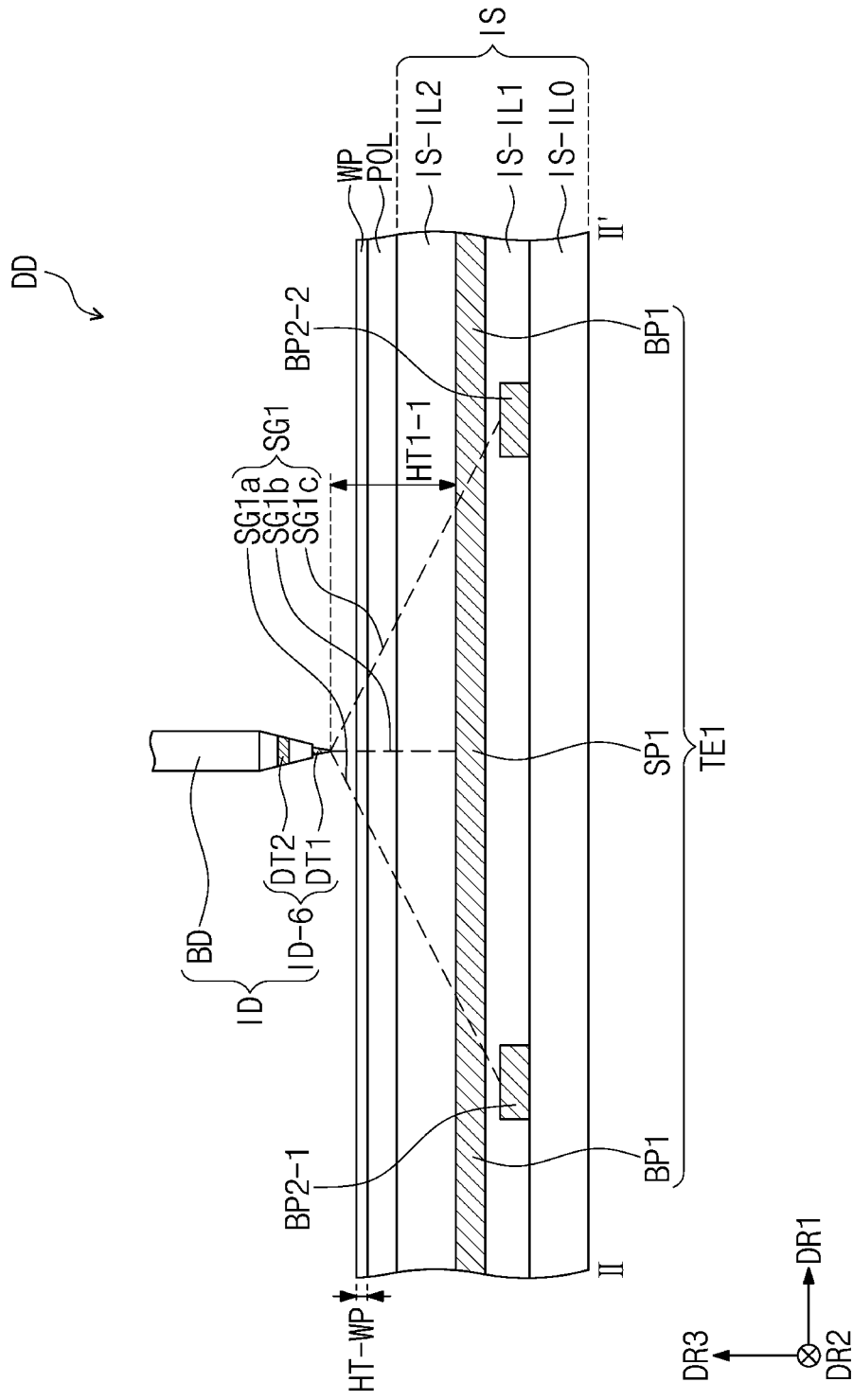
FIG. 7 is a cross-sectional view of an electronic device taken along line II-II' of FIG. 6 according to an embodiment of the present inventive concepts.
Figure 8:
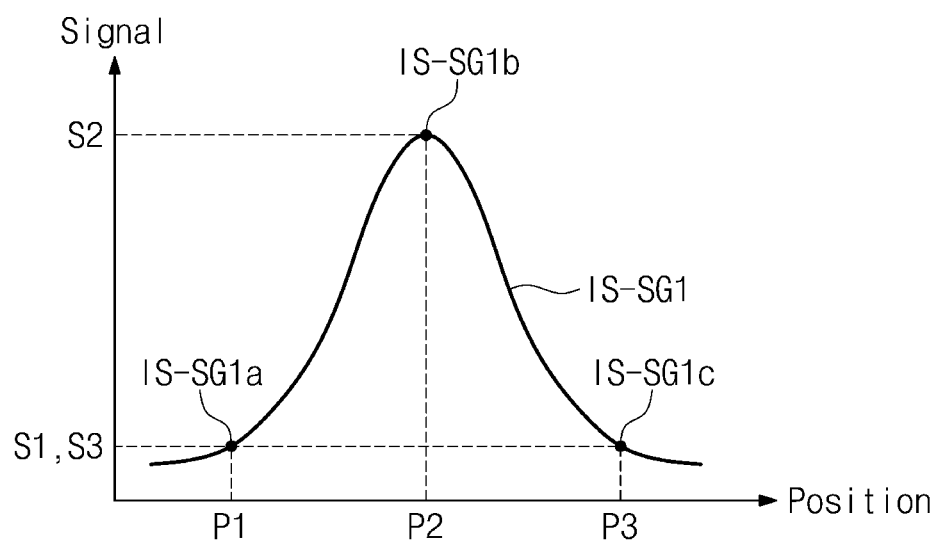
FIG. 8 illustrates a signal of an input sensor which receives a first signal according to an embodiment of the present inventive concepts.

FIG. 7 is a cross-sectional view of a part of an electronic device taken along line II-II' of FIG. 6 according to an embodiment of the present inventive concepts. FIG. 8 illustrates a signal of an input sensor which receives a first signal according to an embodiment of the present inventive concepts.

Referring to the embodiments of FIGS. 6 to 8, the electronic device may further include an anti-reflection layer POL and a window WP.

The anti-reflection layer POL may be disposed on the input sensor IS. For example, as shown in the embodiment of FIG. 7, a lower surface of the anti-reflection layer POL may directly contact an upper surface of the input sensor IS, such as an upper surface of the second insulating layer IS-IL2. In an embodiment, the anti-reflection layer may include a polarizing layer. For example, the anti-reflection layer may include a polarizer and a phase retarder. The polarizer and the phase retarder may include an expandable synthetic resin film or a coating-type synthetic resin film. For example, the anti-reflection layer may be provided by dyeing a polyvinyl alcohol film with an iodine compound. However, embodiments of the present inventive concepts are not limited thereto. The anti-reflection layer may reduce the reflectivity of external light.

The window WP may be disposed on the anti-reflection layer POL. For example, as shown in the embodiment of FIG. 7, a lower surface of the window WP may directly contact an upper surface of the anti-reflection layer POL. In an embodiment, the window WP may include an optically transparent insulating material. For example, the window WP may include glass or plastic. The window WP may have a single-layer structure or a multi-layered structure. For example, the window WP may include a plurality of plastic films bonded with an adhesive, or may include a glass substrate and a plastic film bonded with an adhesive. However, embodiments of the present inventive concepts are not limited thereto.

The input device ID may be disposed on, or in proximity to, the window WP and may transmit a first signal SG1.

As shown in the embodiments of FIGS. 6-7, the bridge pattern BP2 disposed adjacent to a first position P1 may be referred to as a first bridge pattern BP2-1, and the bridge pattern BP2 disposed adjacent to a third position P3 may be referred to as a second bridge pattern BP2-2.

In the embodiment shown in FIG. 7, for purposes of explanation, the input device ID may be disposed at a place which overlaps a second position P2 which is positioned between the first position P1 and the third position P3 (e.g., in the first direction DR1). However, embodiments of the present inventive concepts are not limited thereto. As shown in the embodiment of FIG. 7, the pen electrode ID-6 may include a first electrode DT1 and a second electrode DT2. The first electrode DT1 may be disposed at an end of the input device ID, such as the at the tip portion of the input device ID that is disposed adjacent to the window WP. The second electrode DT2 may be disposed at a side of a body BD. For example, as shown in the embodiment of FIG. 7, the second electrode DT2 may be spaced apart in the third direction DR3 from the first electrode DT1 disposed on the tip portion of the input device ID. The input sensor IS may obtain a coordinate of the input device ID through the first electrode DT1 and an inclination of the input device ID through the second electrode DT2.

The first electrode DT1 may transmit the first signal SG1. The first signal SG1 may have a first frequency. In an embodiment, the first frequency may be in a range of about 100 kHz to about 140 kHz. For example, the first frequency may be about 120 kHz. However, embodiments of the present inventive concepts are not limited thereto and the first frequency may have various different frequency ranges. For example, the first frequency may be in a range of about 210 kHz to about 250 kHz. The first signal SG1 may form an electric field. The input sensor IS may obtain a sensing signal IS-SG1 having a shape of Gaussian distribution from the plurality of sensing electrodes, such as the electrodes TE1 and the cross electrodes TE2 sensing the electric field.

As shown in the embodiment of FIG. 7, the first signal SG1 may include a first sub-signal SG1a, a second sub-signal SG1b, and a third sub-signal SG1c. The first sub-signal SG1a, the second sub-signal SG1b, and the third sub-signal SG1c are classified according to an angle at which the first signal is emitted. The first sub-signal SG1a may be emitted toward the first position P1. The second sub-signal SG1b may be emitted toward the second position P2. The third sub-signal SG1c may be emitted toward the third position P3. However, embodiments of the present inventive concepts are not limited thereto.

As shown in FIG. 8, by sensing the first sub-signal SG1a in the first bridge pattern BP2-1, the input sensor IS may obtain a first sensing signal IS-SG1a of a first strength S1 at the first position P1 of the first bridge pattern BP2-1. By sensing the second sub-signal SG1b in the first portion SP1, the input sensor IS may obtain a second sensing signal IS-SG1b of a second strength S2 at the second position P2 of the first portion SP1. By sensing the third sub-signal SG1c in the second bridge pattern BP2-2, the input sensor IS may obtain a third sensing signal IS-SG1c of a third strength S3 at the third position P3 of the second bridge pattern BP2-2.

The input sensor IS may generate the sensing signal IS-SG1 by combining the first sensing signal IS-SG1a, the second sensing signal IS-SG1b, and the third sensing signal IS-SG1c. The input sensor IS may obtain a sensing coordinate SC (see FIG. 13A) by sensing an input from an outside source through the sensing signal IS-SG1. Although FIG. 8 exemplarily illustrates that the first strength S1 and the third strength S3 are the same, the first strength S1 and the third strength S3 according to an embodiment of the present inventive concepts may be recognized as being different from each other depending on the position where the input device ID is disposed.

For example, if the first strength S1 of the first sensing signal IS-SG1a and the third strength S3 of the third sensing signal IS-SG1c are different from each other, the sensing coordinate SC (see FIG. 13A) may be obtained by comparing the first strength S1 and the third strength S3. For example, if the first strength S1 is greater than the third strength S3, the input sensor IS may recognize the sensing coordinate SC (see FIG. 13A) as a coordinate moved in the direction towards the first position P1 from the second position P2. If the first strength S1 is smaller than the third strength S3, the input sensor IS may recognize the sensing coordinate SC (see FIG. 13A) as a coordinate moved in the direction towards the third position P3 from the second position P2.

The window WP according to an embodiment of the present inventive concepts may be a relatively thin window. For example, the thickness HT-WP of the window WP (e.g., length in the third direction DR3) may be about 0.5 mm (millimeter) or less. Therefore, the thickness of the electronic device DD (see FIG. 1) may be relatively thin. The distance HT1-1 (e.g., length in the third direction DR3) between the first electrode DT1 and the plurality of sensing electrodes, such as the plurality of electrodes and cross electrodes TE1, TE2 may decrease.

Accordingly, the width of the electric field of the first signal SG1 emitted from the first electrode DT1 may decrease. The first strength S1 of the first sensing signal IS-SG1 for the first position P1 and the third strength S3 of the first sensing signal IS-SG1 for the third position P3 strength recognized by the input sensor IS may decrease. Therefore, the difference between the second strength S2 and each of the first strength S1 and the third strength S3 may increase. In this case, the input sensor IS may sense the sensing coordinate SC (see FIG. 13A) as a coordinate leaning toward the first position P1 or the third position P3. Therefore, a straight line input by the input device ID may be sensed as a zigzag shape and the linearity of inputs input by the input device ID may decrease. The linearity of the input may be increased by increasing the number of sensing electrodes to obtain an exact coordinate. However, according to an embodiment of the present inventive concepts, the controller CT (see FIG. 5A) may correct the sensing coordinate SC (see FIG. 13A). The controller CT (see FIG. 5A) may obtain the calculated coordinate CC (see FIG. 13C) by correcting the sensing coordinate SC (see FIG. 13A). The calculated coordinate CC (see FIG. 13C) may be the same as a coordinate input by the input sensor IS. Therefore, though the number of sensing electrodes increases, the number of sensing lines may not increase. In this way, an increase in an area of the peripheral area IS-NAA may be prevented.

As shown in the embodiment of FIG. 6, the first portion SP1 may have a first width WD1 (e.g., length in the second direction DR2). The bridge pattern BP2 may have a second width WD2. The maximum value of the first width WD1 may be greater than the maximum value of the second width WD2. For example, as shown in the embodiment of FIG. 6, the first portion SP1 may have a maximum first width WD1 at a central portion (e.g., in the first direction DR1) of the first portion SP1. However, embodiments of the present inventive concepts are not limited thereto.

Accordingly, the area of the first portion SP1 (e.g., in a plane defined in the first and second directions DR1, DR2) may be larger than the area of the second portion BP1. Therefore, a change in capacitance measured in the first portion SP1 may be different from a change in capacitance measured in the second portion BP1. The difference in the change of capacitance may increase the difference between the second strength S2 and each of the first strength S1 and the third strength S3. In this case, the sensing coordinate SC (see FIG. 13A) sensed by the input sensor IS may be sensed as a coordinate leaning toward the first position P1 or the third position P3. Therefore, a straight line input by the input device ID may be sensed as a zigzag shape. However, according to an embodiment of the present inventive concepts, the controller CT (see FIG. 5A) may correct the sensing coordinate SC (see FIG. 13A). The controller CT (see FIG. 5A) may obtain the calculated coordinate CC (see FIG. 13C) by correcting the sensing coordinate SC (see FIG. 13A). The calculated coordinate CC (see FIG. 13C) may be the same as a coordinate input by the input sensor IS. Therefore, the coordinate accuracy of the input sensor IS may be increased and the linearity of inputs from the input device ID may be increased.

Figure 9:
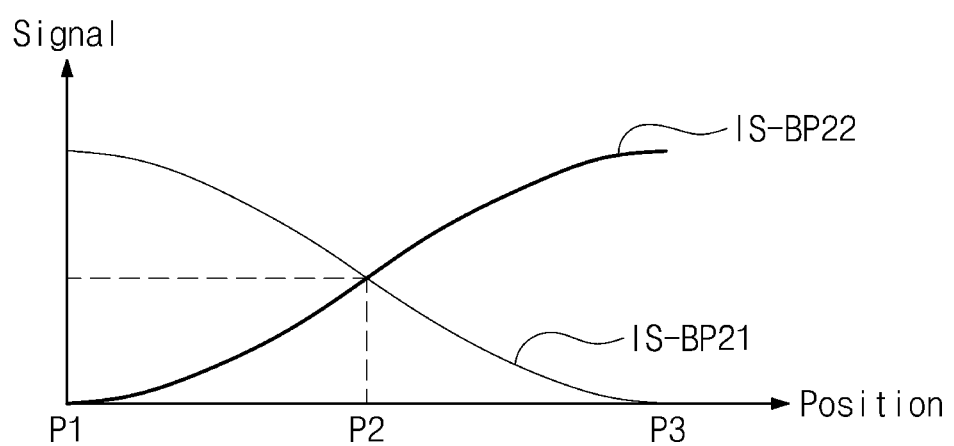
FIG. 9 illustrates signal strength in accordance with input positions of a plurality of bridge patterns according to an embodiment of the present inventive concepts.
Figure 10:
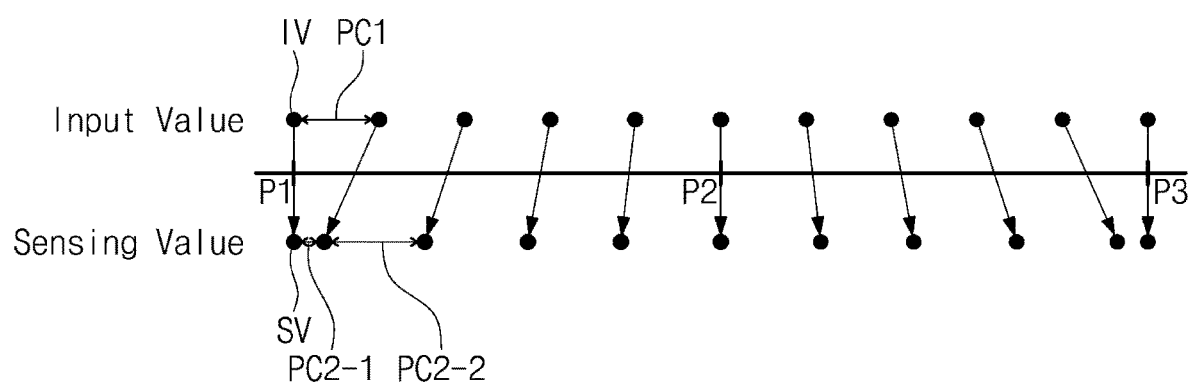
FIG. 10 illustrates an input value provided to an input sensor and a sensing value for the input value according to an embodiment of the present inventive concepts.

FIG. 9 illustrates signal strengths in accordance with input positions of a plurality of bridge patterns according to an embodiment of the present inventive concepts. FIG. 10 illustrates input values provided to an input sensor and sensing values for the input values according to an embodiment of the present inventive concepts.

Referring to FIGS. 6 to 10, a first graph IS-BP21 in FIG. 9 shows signal strengths measured in the first bridge pattern BP2-1 and input from the first position P1 to the third position P3. As shown in the embodiment of FIG. 9, the first graph IS-BP21 may have a curve. As the first graph IS-BP21 moves from the first position P1 to the second position P2, an angle of inclination (or declination) of the curve thereof may increase. As the first graph IS-BP21 moves from the second position P2 to the third position P3, an angle of inclination (or declination) of the curve may decrease.

The second graph IS-BP22 shows signal strengths measured in the second bridge pattern BP2-2 and input from the first position P1 to the third position P3. The second graph IS-BP22 may have a curve. As the second graph IS-BP22 moves from the first position P1 to the second position P2, an angle of inclination of the curve may decrease. As the second graph IS-BP22 moves from the second position P2 to the third position P3, an angle of inclination of the curve may increase.

As shown in the embodiment of FIG. 10, an input value IV may be input into the input sensor IS uniformly at a first interval PC1 along the first position P1, the second position P2, and the third position P3. The input value IV may be a coordinate of a position where the input value IV is input from an outside source. For example, the input value IV may be a coordinate of a position of each of a user's body OI (see FIG. 2) and the input device ID (see FIG. 2).

The input sensor IS may obtain a sensing value SV on the basis of the input value IV. The sensing value SV may be a coordinate sensed by the input sensor IS as an input value IV. While the input value IV and the sensing value SV should be the same, the input value IV and the sensing value SV may be sensed as being different from each other, depending on each shape of the first graph IS-BP21 and the second graph IS-BP22. As shown in the embodiment of FIG. 10, first and second intervals PC2-1, PC2-2 between sensing values SV may be different. For example, the sensing values SV between the first position P1 and the second position P2 may be sensed as leaning toward the first position P1. The sensing values SV between the second position P2 and the third position P3 may be sensed as leaning toward the third position P3. An input value IV input by the input sensor IS and a sensing value SV actually sensed may be different. According to an embodiment of the present inventive concepts, however, the controller CT may correct a sensing value SV. The controller CT may obtain a calculated coordinate CC (see FIG. 13C) identical to the input value IV by correcting the sensing value SV. The coordinate accuracy of the electronic device DD may be increased and the electronic device DD with increased sensing reliability may be provided.

Figure 11A:
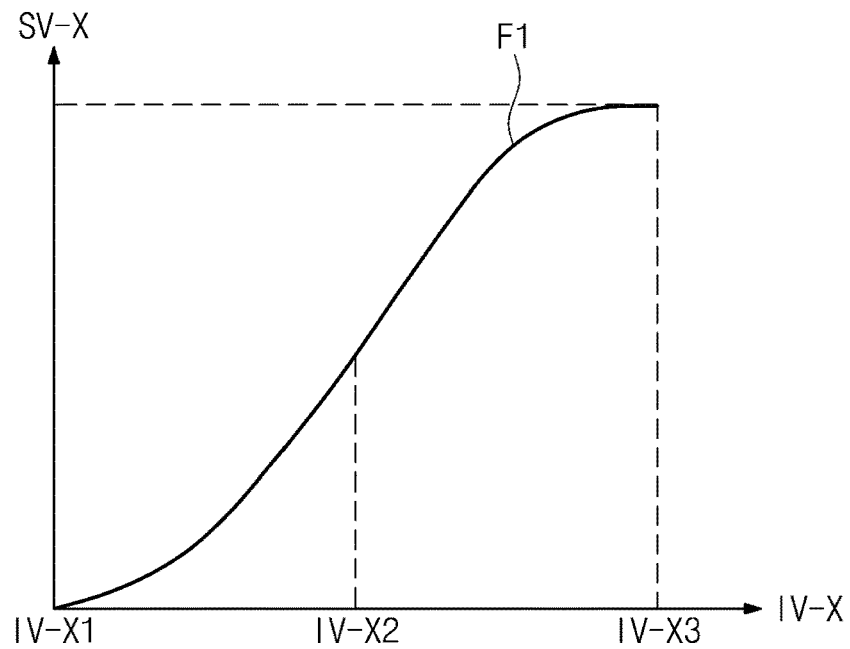
FIG. 11A illustrates a first function according to an embodiment of the present inventive concepts.
Figure 11B:
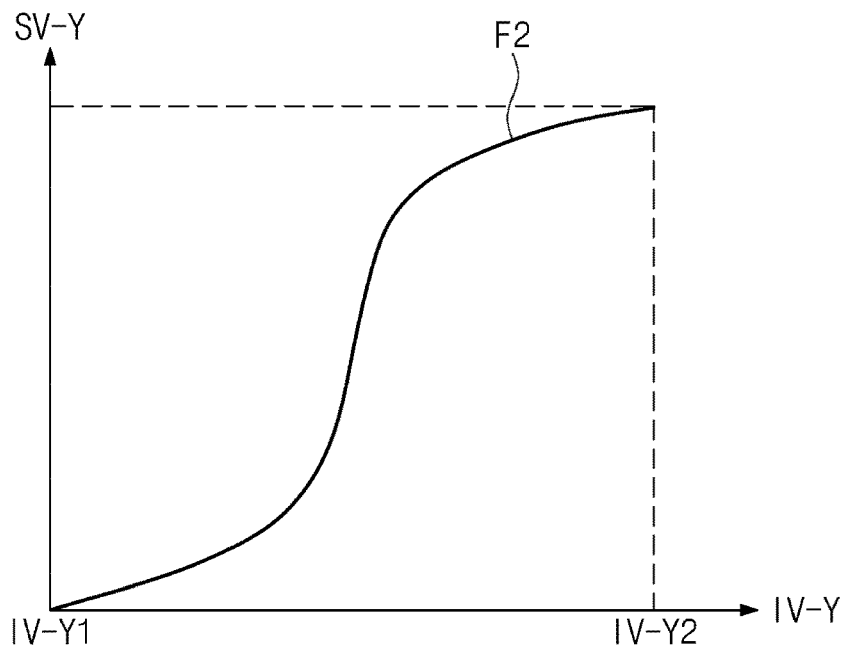
FIG. 11B illustrates a second function according to an embodiment of the present inventive concepts.

According to an embodiment of the present inventive concepts, FIG. 11A illustrates a first function and FIG. 11B illustrates a second function.

Referring to the embodiments of FIGS. 5A, 6, 11A, and 11B, the memory MM may include a first modeling data MD) and a second modeling data MD2 stored therein.

In an embodiment, the first modeling data MD1 may be obtained from a first sensing unit SU1 and a second sensing unit SU2 adjacent to the first sensing unit SU1 (e.g., adjacent in the first direction DR1). For example, as shown in the embodiment of FIG. 6, the first sensing unit SU1 may be immediately adjacent to the second sensing unit SU2 (e.g., in the first direction DR1). The first sensing unit SU1 may be one among the plurality of sensing units SU.

The first modeling data may have sensing values for input values continuously input from the outside source along the first direction DR1 from the first position P1 to the third position P3. The input values may be x values of coordinates at the locations of inputs from the outside source, such as an input by a user's body OI or an input by an input device ID. The sensing values may be x values of coordinates where the input values are sensed by the input sensor IS. The first position P1 may be referred to as an intermediate point P1 of the first sensing unit SU1, and the third position P3 may be referred to as an intermediate point P3 of the second sensing unit SU2. For example, the first position P1 and the third positions P3 may be disposed at central portions (e.g., in the first and second directions DR1, DR2) of the first and second sensing units SU1, SU2, respectively. However, embodiments of the present inventive concepts are not limited thereto and the first position P1 and the third position P3 may be located at other portions of the first and second sensing units SU1, SU2, respectively in other embodiments.

In an embodiment, the first modeling data MD1 may be stored in the memory MM in the form of the first function F1. As shown in FIG. 11A, input values IV-X continuously input along the first direction DR1 from the first position P1 to the third position P3 may be defined as an x-axis of the first function FL. For example, an x value of the first function F1 corresponding to the first position P1 may be a first input value IV-X1. An x value of the first function F1 corresponding to the second position P2 may be a second input value IV-X2. An x value of the first function F1 corresponding to the third position P3 may be a third input value IV-X3. Sensing values SV-X for input values IV-X may be defined as a y-axis of the first function F1.

The second modeling data MD2 may be obtained from the first sensing unit SU1 and the third sensing unit SU3 adjacent to the first sensing unit SU1 in the second direction DR2. For example, as shown in the embodiment of FIG. 6, the third sensing unit SU3 may be immediately adjacent to the first sensing unit SU1 (e.g., in the second direction DR2).

The second modeling data MD2 may have sensing values for input values continuously input along the second direction DR2 from the first position P1 to the fourth position P4. The input values may be y values of coordinates at the locations of inputs from the outside source. The sensing values may be y values of coordinates where the input values are sensed by the input sensor IS. The fourth position P4 may be referred to as an intermediate point P4 of the third sensing unit SU3. For example, the fourth position P4 may be disposed at central portions (e.g., in the first and second directions DR1, DR2) of the third sensing units SU3. However, the location of the fourth position P4 is not limited to an intermediate point of the third sensing unit SU3.

The second modeling data MD2 may be stored in the memory MM in the form of the second function F2. Input values IV-Y continuously input along the second direction DR2 from the first position P1 to the fourth portion P4 may be defined as an x-axis of the second function F2. For example, an x value of the second function F2 corresponding to the first position P1 may be a first input value IV-Y1. An x value of the second function F2 corresponding to the fourth position P4 may be a second input value IV-Y2. Sensing values SV-Y for input values IV-Y may be defined as a y-axis of the second function F2.

Although the embodiments of FIGS. 11A and 11B illustrate a first function F1 and a second function F2, the shapes of which are different from each other, the shapes of the first function F1 and the second function F2 according to an embodiment of the present inventive concepts are not limited thereto. For example, in an embodiment, the first function F1 and the second function F2 may have substantially the same shape. Furthermore, the first and second modeling data MD1, MD2 are not limited to the embodiments shown in FIGS. 11A-11B. For example, each of the first modeling data MD1 and the second modeling data MD2 may be stored in the memory MM in the form of a lookup table, etc. Furthermore, in some embodiments, the first modeling data MD1 may be obtained by input values continuously input from three or more adjacent sensing units in the first direction DR1 and the second modeling data MD2 may be obtained by input values continuously input from three or more adjacent sensing units in the second direction DR2.

Figure 12:
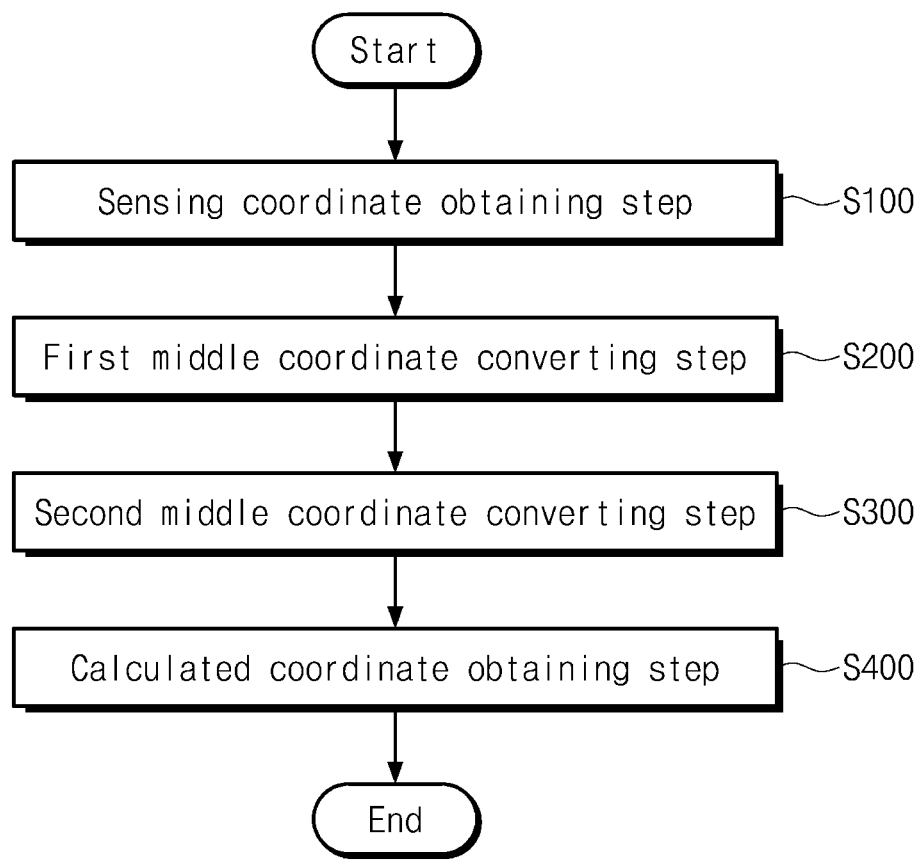
FIG. 12 is a flowchart illustrating a coordinate correcting method according to an embodiment of the present inventive concepts.
Figure 13B:
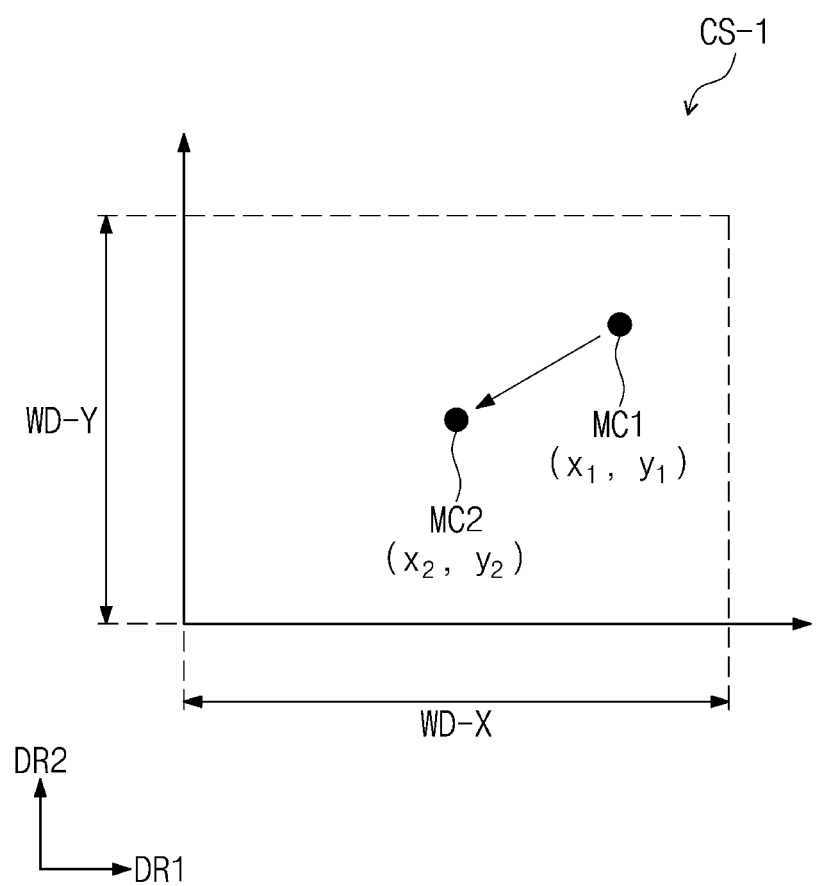
FIG. 13B illustrates obtaining a second middle coordinate according to an embodiment of the present inventive concepts.
Figure 13C:
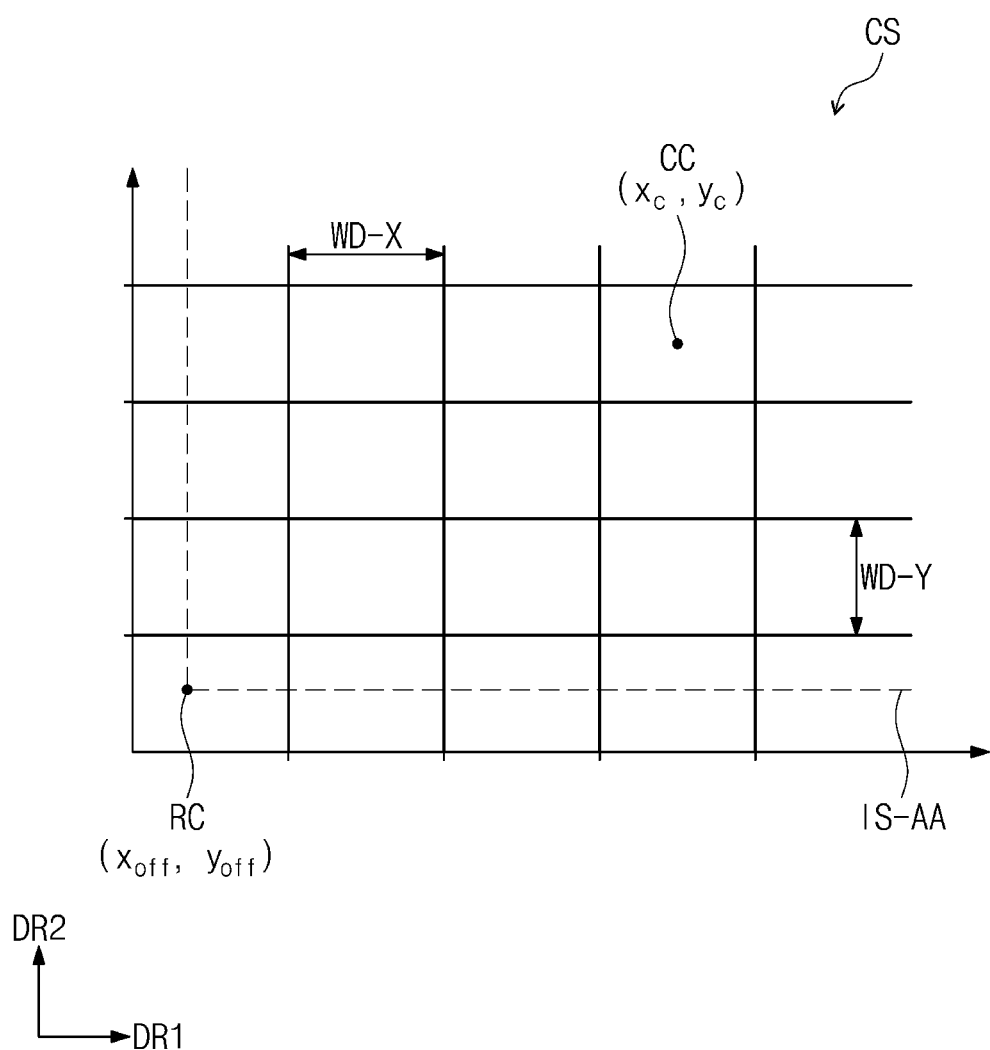
FIG. 13C illustrates obtaining a calculated coordinate according to an embodiment of the present inventive concepts.

FIG. 12 is a flowchart illustrating a coordinate correcting method according to an embodiment of the present inventive concepts. FIG. 13A illustrates obtaining a sensing coordinate according to an embodiment of the present inventive concepts. FIG. 13B illustrates obtaining a second middle coordinate according to an embodiment of the present inventive concepts. FIG. 13C illustrates obtaining a calculated coordinate according to an embodiment of the present inventive concepts.

Referring to the embodiments of FIGS. 5A and 11A to 13C, in block S100 shown in FIG. 12, the input sensor IS may obtain a sensing coordinate SC by sensing an input from an outside source. An x value of the sensing coordinate SC may be $x_{in}$, and an y value of the sensing coordinate SC may be $y_{in}$. The controller CT may obtain a calculated coordinate CC by correcting the sensing coordinate SC obtained by the input sensor IS.

As shown in the embodiment of FIG. 5A, the controller CT may include a first reference point moving unit CT1, a coordinate correction unit CT2, and a second reference point moving unit CT3. While the first reference point moving unit CT1, the coordinate correction unit CT2 and the second reference point moving unit CT3 are shown as three separate units in the embodiment of FIG. 5A for convenience of explanation, embodiments of the present inventive concepts are not limited thereto and one or more of the first reference point moving unit CT1, the coordinate correction unit CT2 and the second reference point moving unit CT3 may be integrated in a same unit.

In block S200, the first reference point moving unit CT1 may convert the sensing coordinate SC into a first middle coordinate MC1 on the basis of a coordinate system CS (FIG. 13A).

As shown in FIG. 13A, the coordinate system CS may cover an active area IS-AA of the input sensor IS. An x-axis of the coordinate system may be parallel to the first direction DR1. A y-axis of the coordinate system CS may be parallel to the second direction DR2.

The coordinate system CS may include a plurality of coordinate units CU. The plurality of coordinate units CU may be arranged in the first direction DR1 and in the second direction DR2. Each of the plurality of coordinate units CU may have a width WD-X in the first direction DR1 and a width WD-Y in the second direction DR2. The width WD-X in the first direction DR1 may be defined from a width WD-SU1 in the first direction DR1 of each of the plurality of sensing units SU. For example, in an embodiment, the width WD-X in the first direction DR1 of each coordinate unit CU may be the same as the width WD-SU1 in the first direction DR1 of each of the plurality of sensing units SU. The width WD-Y of the coordinate unit CU in the second direction DR2 may be defined from the width WD-SU2 in the second direction DR2 of each of the plurality of sensing units SU. For example, in an embodiment, the width WD-X in the first direction DR1 may be the same as the width WD-Y in the second direction DR2.

The memory MM may further include a reference coordinate RC. The reference coordinate RC may be a reference point of a sensing coordinate in the coordinate system. The reference coordinate RC may be a coordinate which defines the active area IS-AA of the input sensor IS. The memory MM may store $x_{off}$ which is an x value of the reference coordinate RC and $y_{off}$ which is a y value of the reference coordinate RC.

The first reference point moving unit CT1 may convert the coordinate system CS into a middle coordinate system CS-1. The middle coordinate system CS-1 may correspond to one of the plurality of coordinate units CU.

The first reference point moving unit CT1 may convert the sensing coordinate SC into a first middle coordinate MC1 on the basis of Equation 1. An x value of the first middle coordinate MC1 may be $x_1$, and a y value of the first middle coordinate MC1 may be $y_1$. The $x_1$ may be referred to as a first x coordinate and $y_1$ may be referred to as a first y coordinate.

$$x_1 = (x_{in} - x_{off}) \bmod (WD\text{-}X)$$
$$y_1 = (y_{in} - y_{off}) \bmod (WD\text{-}Y) \qquad \text{[Equation 1]}$$

In Equation 1, $x_1$ may be a remainder of a value obtained by dividing the difference between $x_{in}$ and $x_{off}$ by the width WD-X in the first direction DR1 of each of the plurality of coordinate units CU.

In block S300, the coordinate correction unit CT2 may obtain a second middle coordinate MC2 by correcting the first middle coordinate MC1 based on the first modeling data MD1 and the second modeling data MD2.

As shown in the embodiment of FIG. 13B, an x value of the second middle coordinate MC2 may be $x_2$, and a y value of the second middle coordinate MC2 may be $y_2$. The $x_2$ may be referred to as a second x coordinate and $y_2$ may be referred to as a second y coordinate.

In an embodiment in which the first modeling data MD1 is the first function F1 and the second modeling data MD2 is the second function F2 as shown in the embodiments of FIGS. 11A-11B, the coordinate correction unit may obtain $x_2$ by substituting $x_1$ into an inverse function of the first function F1 and obtain $y_2$ by substituting $y_1$ into an inverse function of the second function F2.

In an embodiment in which each of the first modeling data MD1 and the second modeling data MD2 is a lookup table, the coordinate correction unit CT2 may obtain $x_2$ by substituting $x_1$ into the lookup table and obtain $y_2$ by substituting $y_1$ into the lookup table.

Each of the first modeling data MD1 and the second modeling data MD2 according to an embodiment of the present inventive concepts may be applied to each of the plurality of coordinate units CU by repeated sensing units SU. For example, the controller CT may apply the first modeling data and the second modeling data, obtained from some of the sensing units SU, to each of the plurality of coordinate units CU of the coordinate system CS.

In block S400, the second reference point moving unit CT3 may obtain a calculated coordinate CC based on the second middle coordinate MC2.

The memory MM may include an integer value obtained by dividing the sensing coordinate SC by the widths in the first direction DR1 and second direction DR2 WD-X, WD-Y of each of the plurality of coordinate units CU. The integer value may include a first integer value and a second integer value. The first integer value may be an integer part of a value obtained by dividing $x_{in}$ by the width WD-X in the first direction DR1. The second integer value may be an integer part of a value obtained by dividing $x_{in}$ by the width WD-Y of the second direction DR2. The first integer value and the second integer value may be stored in the memory MM. In an embodiment, the controller CT may obtain the integer value from the sensing coordinate SC.

The second reference point moving unit CT3 may convert the second middle coordinate MC2 into the calculated coordinate CC on the basis of Equation 2. The x value of the calculated coordinate CC may be $x_c$, and the y value of the calculated coordinate CC may be $y_c$ $$x_c = x_2 + (\text{first integer value}*(WD\text{-}X)) + x_{off}$$

$$y_c = y_2 + (\text{second integer value}*(WD\text{-}Y)) + y_{off} \quad [\text{Equation 2}]$$

The calculated coordinate CC may be a value obtained by adding the second middle coordinate MC2, a value obtained by multiplying the integer value by the width in the first direction DR1 and the second direction DR2 WD-X, WD-Y of each of the plurality of coordinate units CU, and the reference coordinate RC. In Equation 2, $x_c$ may be a value obtained by adding $x_2$, a value obtained by multiplying the first integer value by the width WD-X of the first direction DR1, and $x_{off}$. In Equation 2, $y_c$ may be a value obtained by adding $y_2$, a value obtained by multiplying the second integer value by the width WD-Y of the second direction DR2, and $y_{off}$.

According to an embodiment of the present inventive concepts, the electronic device DD may include an input sensor IS, a controller CT, and a memory MM. A first modeling data MD1 and a second modeling data MD2 may be stored in the memory MM. The controller CT may obtain a calculated coordinate CC identical to an input value IV received from an outside source by correcting a sensing value sensed by the input sensor IS based on the first modeling data MD1 and the second modeling data MD2. Therefore, the coordinate accuracy of the input sensor IS may be increased and the electronic device DD with increased reliability may be provided.

According to the present inventive concepts, an electronic device may include an input sensor, a controller, and a memory. A first modeling data and a second modeling data may be stored in a memory. The controller may obtain same calculated coordinates as actually inputted input values by correcting sensing values sensed by the input sensor on the basis of the first modeling data and the second modeling data. Accordingly, the accuracy of coordinates of the electronic device may be increased.

Although the embodiments of the present inventive concepts have been described, it is understood that the present inventive concepts should not be limited to these embodiments but various changes and modifications may be made by a person having ordinary skill in the art within the spirit and scope of the present inventive concepts as hereinafter claimed. Accordingly, the technical scope of the present inventive concepts is not restricted to the embodiments described in the detailed description.

What is claimed is:

1. An electronic device comprising:
   an input sensor configured to sense an input from an outside source to obtain a sensing coordinate, the input sensor having a plurality of sensing units defined therein;
   a memory storing a first modeling data and a second modeling data, wherein:
   the first modeling data is obtained from a first sensing unit and a second sensing unit of the plurality of sensing units, the second sensing unit is positioned adjacent to the first sensing unit in a first direction, and
   the second modeling data is obtained from the first sensing unit and a third sensing unit of the plurality of sensing units, the third sensing unit is positioned adjacent to the first sensing unit in a second direction that crosses the first direction; and
   a controller configured to correct the sensing coordinate to obtain a calculated coordinate, wherein the controller comprises:
   a first reference point moving unit configured to convert the sensing coordinate into a first middle coordinate based on a coordinate system having a plurality of coordinate units, each coordinate unit of the plurality of coordinate units is defined by a width of each of the plurality of sensing units;
   a coordinate correction unit configured to obtain a second middle coordinate by correcting the first middle coordinate based on the first modeling data and the second modeling data; and
   a second reference point moving unit configured to obtain the calculated coordinate based on the second middle coordinate.

2. The electronic device of claim 1, wherein the first modeling data includes sensing values for input values continuously input along the first direction from a first point of the first sensing unit to a second point of the second sensing unit.

3. The electronic device of claim 2, wherein the second modeling data includes sensing values for input values continuously input along the second direction from the first point of the first sensing unit to a third point of the third sensing unit.

4. The electronic device of claim 3, wherein:
   the first modeling data is stored in the memory in a form of a first function; and
   the second modeling data is stored in the memory in a form of a second function.

5. The electronic device of claim 4, wherein the first function and the second function have a substantially same shape.

6. The electronic device of claim 4, wherein:
   the first middle coordinate includes a first x-coordinate and a first y-coordinate and the second middle coordinate includes a second x-coordinate and a second y-coordinate; and
   the coordinate correction unit is configured to obtain the second x-coordinate by substituting the first x-coordinate in a first inverse function of the first function, and
   the coordinate correction unit is configured to obtain the second y-coordinate by substituting the first y-coordinate in a second inverse function of the second function.

7. The electronic device of claim 3, wherein each of the first modeling data and the second modeling data is stored in the memory in a form of a lookup table.

8. The electronic device of claim 1, wherein the memory further stores a reference coordinate that is a reference point of the sensing coordinate in the coordinate system.

9. The electronic device of claim 8, wherein the first middle coordinate is a remainder of a value obtained by subtracting the reference coordinate from the sensing coordinate to obtain a subtraction result value and then dividing the subtraction result value by the width of each of the plurality of sensing units.

10. The electronic device of claim 8, wherein the memory further comprises an integer value obtained by dividing the sensing coordinate by the width of each of the plurality of sensing units.

11. The electronic device of claim 10, wherein the second reference point moving unit is configured to obtain the calculated coordinate by adding the second middle coordinate, a multiplication result value obtained by multiplying the integer value by the width of each of the plurality of sensing units, and the reference coordinate.

12. The electronic device of claim 1, wherein each of the plurality of sensing units comprises an electrode extending in the first direction and a cross electrode extending in the second direction, the cross electrode is insulated from the electrode and crosses the electrode.

13. The electronic device of claim 12, wherein:
the input sensor is configured to sense an input by a touch through a change in mutual capacitance formed between the electrode and the cross electrode; and
the input sensor is configured to sense an input by an input device through a change in capacitance of each of the electrode and the cross electrode.

14. A method for correcting coordinates, the method comprising:
obtaining a sensing coordinate from an input sensor having a plurality of sensing units defined therein;
obtaining a first modeling data from a first sensing unit and a second sensing unit of the plurality of sensing units, the second sensing unit is positioned adjacent to the first sensing unit in a first direction;
obtaining a second modeling data from the first sensing unit and a third sensing unit of the plurality of sensing units, the third sensing unit is positioned adjacent to the first sensing unit in a second direction crossing the first direction;
converting the sensing coordinate into a first middle coordinate based on a coordinate system having a plurality of coordinate units, each coordinate unit of the plurality of coordinate units is defined by a width of each of the plurality of sensing units;
obtaining a second middle coordinate by correcting the first middle coordinate based on the first modeling data and the second modeling data; and
obtaining a calculated coordinate based on the second middle coordinates.

15. The method of claim 14, wherein the obtaining of the first modeling data includes obtaining a first function having sensing values for input values continuously input along the first direction from a first point of the first sensing unit to a second point of the second sensing unit.

16. The method of claim 15, wherein the obtaining of the second modeling data includes obtaining a second function having sensing values for input values continuously input along the second direction from the first point of the first sensing unit to a third point of the third sensing unit.

17. The method of claim 16, wherein:
the first middle coordinate includes a first x-coordinate and a first y-coordinate and the second middle coordinate includes a second x-coordinate and a second y-coordinate; and
the second middle coordinate is obtained by substituting the first x-coordinate in a first inverse function of the first function to obtain a second x-coordinate and by substituting the first y-coordinate in a second inverse function of the second function to obtain a second y-coordinate.

18. The method of claim 16, wherein the first function and the second function have substantially the same shape.

19. The method of claim 14, wherein the converting of the sensing coordinate into the first middle coordinates includes:
subtracting a reference coordinate that is a reference point of the sensing coordinates in the coordinate system from the sensing coordinates to obtain a subtraction result value; and
calculating a remainder of a value obtained by dividing the subtraction result value by the width of each of the plurality of sensing units.

20. The method of claim 19, wherein:
the obtaining of the calculated coordinate comprises adding the second middle coordinate, a multiplication value obtained by multiplying an integer value by the width of each of the plurality of sensing units, and the reference coordinate,
wherein the integer value is obtained by dividing the sensing coordinate by the width of each of the plurality of sensing units.

* * * * *